(12) United States Patent
Negoro

(10) Patent No.: US 8,169,039 B2
(45) Date of Patent: May 1, 2012

(54) SEMICONDUCTOR DEVICE

(75) Inventor: Takaaki Negoro, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 87 days.

(21) Appl. No.: 12/848,565

(22) Filed: Aug. 2, 2010

(65) Prior Publication Data

US 2011/0042745 A1 Feb. 24, 2011

(30) Foreign Application Priority Data

Aug. 18, 2009 (JP) .................. 2009-189455

(51) Int. Cl.
*H01L 27/12* (2006.01)
*H01L 29/78* (2006.01)

(52) U.S. Cl. ........ 257/402; 257/205; 257/392; 257/348; 257/E27.112; 257/E29.255; 257/E29.055; 257/213; 257/347; 257/409

(58) Field of Classification Search .................. 257/348, 257/205, 392, 402, E27.112, E29.255, E29.055, 257/213, 347, 409

See application file for complete search history.

(56) References Cited

FOREIGN PATENT DOCUMENTS

| JP | 2001-119031 | 4/2001 |
|---|---|---|
| JP | 2002-134752 | 5/2002 |
| JP | 2003-69026 | 3/2003 |
| JP | 2004-281864 | 10/2004 |
| JP | 2008-53389 | 3/2008 |

*Primary Examiner* — Matthew Reames
*Assistant Examiner* — Benjamin Tzu-Hung Liu
(74) *Attorney, Agent, or Firm* — Cooper & Dunham LLP

(57) ABSTRACT

A disclosed semiconductor device includes an MOS transistor having an N-type low-concentration drain region, a source region, an ohmic drain region, a P-type channel region, an ohmic channel region, a gate isolation film, and a gate electrode. The N-type low-concentration drain region includes two low-concentration drain layers in which the N-type impurity concentration of the upper layer is higher than that of the lower layer; the P-type channel region includes two channel layers in which the P-type impurity concentration of the upper layer is lower than that of the lower layer; and the gate electrode is formed on the P-type channel region and the N-type low-concentration drain region and disposed to be separated from the ohmic drain region when viewed from the top.

6 Claims, 17 Drawing Sheets

SEMICONDUCTOR DEVICE

CROSS-REFERENCE TO RELATED APPLICATIONS

The present application claims priority under 35 U.S.C §119 based on Japanese Patent Application No. 2009-189455 filed Aug. 18, 2009, the entire contents of which are hereby incorporated herein by reference.

BACKGROUND OF THE INVENTION

1. Field of the Invention

The present invention generally relates to a semiconductor device, and more particularly to a structure of a partially-depleted high-voltage MOS (Metal Oxide Semiconductor) transistor using an SOI (Silicon On Insulator) substrate.

2. Description of the Related Art

With the development of the technologies of computers and portable devices, the number of ICs (Integrated Circuits) capable of receiving multiple voltages for integrating various functions has been increasing. As a result of the increase of such ICs, technologies integrating MOS transistors ranging from low-voltage to high-voltage MOS transistors into a single chip have been becoming more and more important. Likewise, technologies for reducing power consumption are also required.

To that end, there are some semiconductor devices having an SOI substrate in which elements are formed in a manner such that the elements are isolated and separated from each other. The SOI substrates have some advantages such as latch-up-free operation and electric energy saving.

Japanese Patent Application Publication Nos. 2002-134752 (Patent Document 1) and 2001-119031 (Patent Document 2) disclose techniques manufacturing high-voltage transistors for several tens of volts using the SOI substrate.

In the semiconductor device of Patent Document 1, the impurity concentration of the channel region in contact with the buried oxide film of the SOI substrate is increased compared with the prior art. By doing this, when a predetermined bias voltage is applied to the supporting substrate, the extension of the inversion layer and the depletion layer generated on the boundary surface between the buried oxide film and the channel region can be controlled. As a result, leakage current flowing on the boundary surface between the buried oxide film and the channel region can be prevented.

In the semiconductor device according to Patent Document 2, a similar effect can be obtained by providing a region under the source region, the region having the same conductivity type as that of the channel region and having higher impurity concentration than that of the channel region.

Further, in the semiconductor device of Patent Document 1, to prevent the increase of the threshold value voltage of the MOS transistor, by adding the channel doping process to adjust the impurity concentration of the channel region, it becomes possible to adequately set the threshold value voltage. In Patent Document 2, it is described that no such process is required.

Each of the structures of the semiconductor devices of Patent Documents 1 and 2 enables increasing the threshold voltage of the parasitic transistor formed of the buried oxide film, and therefore is effective for a high-voltage operation.

Further, in the semiconductor device of Patent Document 1, the channel concentration is increased by diffusion. As a result, the threshold value of the primary MOS transistor is increased. To address the increase, the implantation process is added to decrease the channel concentration of the surface side.

Further, in Patent Document 2, it is described that the leakage current is controlled by increasing the concentration of the diffusion layer having the same conductivity type as that of the channel diffusion layer under the source region so as to prevent the current flowing to the source even when the parasitic transistor is operated.

However, regarding the structures of semiconductor devices of Patent Documents 1 and 2, there is no discussion (description) about the concentration ratio between the drain diffusion and the channel diffusion in either of Patent Documents 1 and 2. As a result, a certain level of thickness of the silicon layer is still required; and therefore, the semiconductor devices still have the structure where the source regions are not in contact with the buried oxide film.

Recently, due to concern about the environment, there is a demand for reducing the energy consumption of the semiconductor devices. Further, in analog circuits, there is a demand for reducing the consumption current and increasing the response speed at the same time.

Generally, the MOS transistor operates using a small constant current source. Because of this feature, to increase the operating speed of the MOS transistor, it is necessary to reduce the input capacitance and the output capacitance of the MOS transistor. For example, there are some ICs, such as those used for watches, that have achieved low energy consumption and high-speed circuits by greatly reducing the junction capacitance using the thin-film SOI substrate.

However, there may be no technique available allowing manufacture of high-voltage MOS transistors operating at or more than 60 volts such as in-vehicle ICs and the like based on an SOI substrate having a thin silicon layer in which the source region and the drain region are in contact with the buried oxide film.

SUMMARY OF THE INVENTION

According to an embodiment of the present invention, there is provided a semiconductor device having an SOI substrate on which an MOS transistor is formed. Further, in the MOS transistor of the semiconductor device, higher breakdown voltage, lower energy consumption, and high-speed operations may be achieved.

According to an aspect of the present invention, a semiconductor device includes a supporting substrate, a buried oxide film formed on the supporting substrate, a silicon layer formed on the buried oxide film, an element separating isolation film included in the silicon layer, and an MOS transistor disposed in a region separated by the element separating isolation film. The MOS transistor includes a first-conductivity-type low-concentration drain region, a source region, an ohmic drain region, a second-conductivity-type channel region, an ohmic channel region, a gate isolation film, and a gate electrode. Each of the first-conductivity-type low-concentration drain region, the source region, the ohmic drain region, the second-conductivity-type channel region, and the ohmic channel region is formed in the silicon layer so as to have a depth from a surface (upper surface) of the silicon layer to the (upper surface of the) buried oxide film. The gate isolation film is formed on the silicon layer so as to form on the second-conductivity-type channel region and (a part of) the first-conductivity-type low-concentration drain region. The gate electrode is formed on the gate isolation film. The first-conductivity-type low-concentration drain region has a relatively low first-conductive-type impurity concentration.

The second-conductivity-type channel region has a relatively low second-conductivity-type impurity concentration and is disposed adjacent to the first-conductivity-type low-concentration drain region. The source region has a first-conductive-type impurity concentration higher than that of the first-conductivity-type low-concentration drain region and is disposed adjacent to the second-conductivity-type channel region in a manner such that the source region is disposed opposite to the first-conductivity-type low-concentration drain region when viewed from the second-conductivity-type channel region. The ohmic drain region has the first-conductive-type impurity concentration higher than that of the first-conductivity-type low-concentration drain region and is disposed adjacent to the first-conductivity-type low-concentration drain region in a manner such that the ohmic drain region is disposed opposite to the second-conductivity-type channel region when viewed from the first-conductivity-type low-concentration drain region. The ohmic channel region has a second-conductive-type impurity concentration higher than that of the second-conductivity-type channel region and is disposed adjacent to the second-conductivity-type channel region. When viewed from a top, the gate electrode is formed on the second-conductivity-type channel region and a part of the first-conductivity-type low-concentration drain region adjacent to the second-conductivity-type channel region and is disposed in a manner such that the gate electrode is separated from the ohmic drain region. The second-conductivity-type channel region includes plural channel layers having different second-conductive-type impurity concentrations from each other in a manner such that the closer the channel layer is to the surface of the silicon layer, the lower the second-conductive-type impurity concentration of the channel layer becomes. The first-conductivity-type low-concentration drain region includes plural low-concentration drain layers having different first-conductive-type impurity concentrations from each other in a manner such that the closer the low-concentration drain layer is to the surface of the silicon layer, the higher the first-conductive-type impurity concentration of the low-concentration drain layer becomes.

Herein, the impurity concentration refers to the actual (practical) impurity concentration which is obtained by subtracting the opposite conductivity type impurity concentration if the opposite conductivity type impurity is included.

BRIEF DESCRIPTION OF THE DRAWINGS

Other objects, features, and advantages of the present invention will become more apparent from the following description when read in conjunction with the accompanying drawings, in which.

DETAILED DESCRIPTION OF THE PREFERRED EMBODIMENTS

Figure 1:
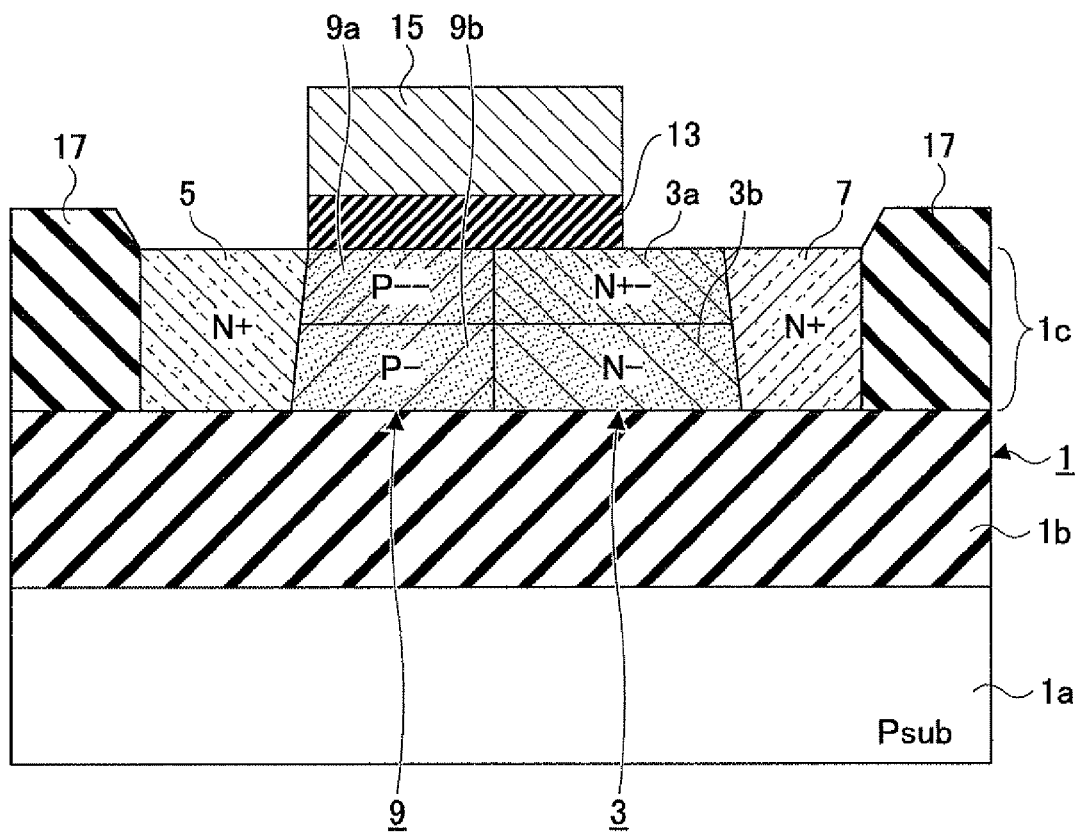
FIG. 1 is a schematic cross-sectional view of an MOS transistor of a semiconductor device according to an embodiment of the present invention, the view being cut along line A-A in FIG. 2.
Figure 2:
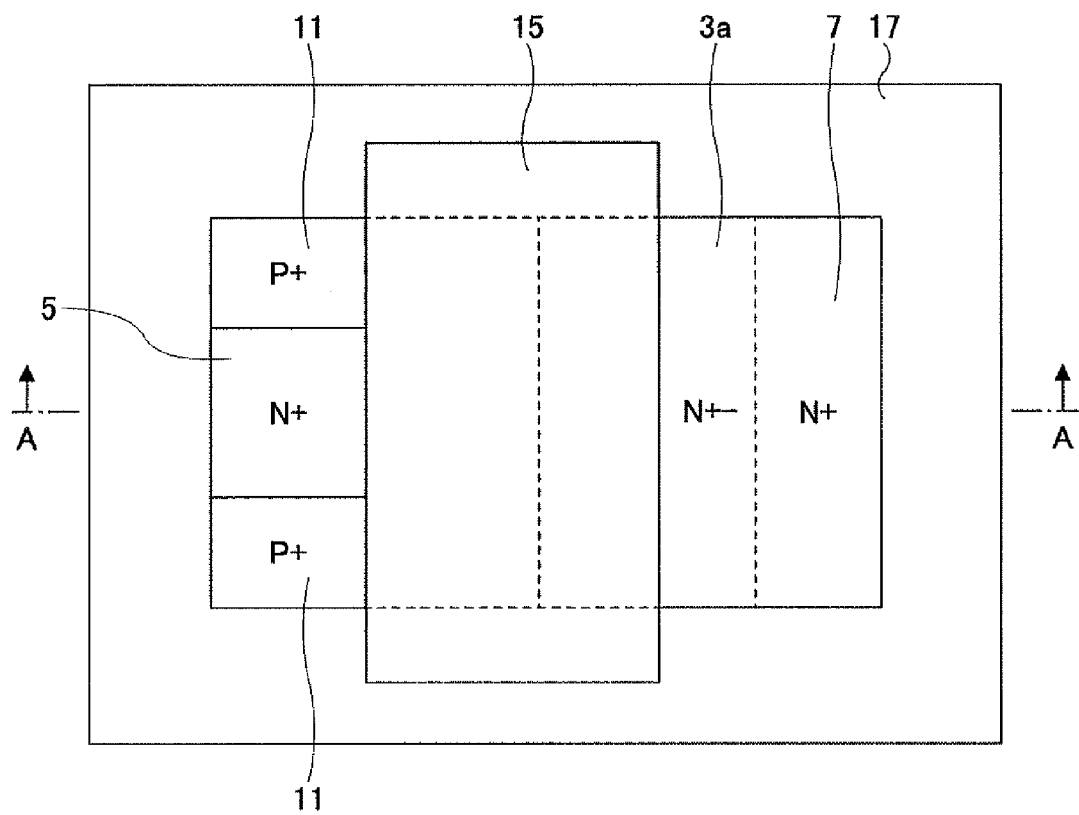
FIG. 2 is a schematic top view of the MOS transistor of FIG. 1.

FIGS. 1 and 2 schematically illustrate the MOS transistor of the semiconductor device according to an embodiment of the present invention. Specifically, FIG. 1 is a cross-sectional view cut along line A-A of FIG. 2, and FIG. 2 is a top view of the semiconductor device of FIG. 1.

As shown in FIG. 1, an SOI substrate 1 has a structure in which a P-type semiconductor substrate 1a (supporting substrate, Psub), a buried oxide film 1b, and a silicon layer 1c are laminated in this order from bottom to top. For example, the film thickness of the buried oxide film 1b is approximately 1 μm. Further, for example, the thickness of the silicon layer 1c is approximately 400 nm; and the silicon layer 1c is a low-concentration p-type silicon layer having a P-type impurity concentration equal to or less than $1 \times 10^{15}$ pcs/cm$^3$.

Further, in the silicon layer 1c, an element separating isolation film 17 is formed, defining the forming region of the MOS transistor. The element separating isolation film 17 is formed of, for example, a LOCOS (local oxidation of silicon) oxide film. The forming region of the MOS transistor is separated from those of any other MOS transistors by the buried oxide film 1b and the element separating isolation film 17.

The MOS transistor includes a N-type low-concentration drain region 3, a source region 5 (N+), an ohmic drain region 7 (N+), a P-type channel region 9, and an ohmic channel region 11 (P+), each of the regions being formed on the buried oxide film 1b and having a thickness (depth) from a (upper) surface of the silicon layer 1c to the (upper) surface of the buried oxide film 1b.

The MOS transistor further includes a gate isolation film 13 and a gate electrode 15. The gate isolation film 13 is formed on the silicon layer 1c in a manner such that the gate isolation film 13 is formed on the P-type channel region 9 and a part of the N-type low-concentration drain region 3. The gate electrode 15 is formed on the gate isolation film 13. For example, the gate isolation film 13 is a silicon oxide film having a film thickness of 120 nm, and the gate electrode 15 is a polysilicon film having a film thickness of 350 nm.

The N-type low-concentration drain region 3 is formed of two low-concentration drain layers 3a and 3b which are formed from top to bottom and have a relatively low concentration of N-type impurity. The N-type impurity concentration of the upper-side low-concentration drain layer 3a (N+−) is higher than that of the lower-side low-concentration drain layer 3b (N−). For example, the practical N-type impurity concentrations of the low-concentration drain layers 3a and 3b are approximately $2.5 \times 10^{17}$ pcs/cm$^3$ and approximately $1.5 \times 10^{17}$ pcs/cm$^3$, respectively.

The P-type channel region 9 is formed of two channel layers 9a and 9b which are formed from top to bottom and have a relatively low concentration of P-type impurity. The P-type impurity concentration of the upper-side channel layer 9a (P−−) is lower than that of the lower-side channel layer 9b (P−). For example, the difference between the practical N-type impurity concentration of the channel layer 9a and that of the channel layer 9b is more than ten times; and the practical P-type impurity concentration of the channel layers 9a and 9b are approximately $6 \times 10^{15}$ pcs/cm$^3$ and approximately $1 \times 10^{17}$ pcs/cm$^3$, respectively.

The N-type impurity concentration of the source region 5 (N+) is higher than that of the N-type low-concentration drain region 3. The source region 5 (N+) is disposed adjacent to the P-type channel region 9 in a manner such that the source region 5 (N+) is disposed opposite to the N-type low-concentration drain region 3 when viewed from the P-type channel region 9. For example, the practical N-type impurity concentration of the source region 5 (N+) is approximately $2 \times 10^{20}$ pcs/cm$^3$.

The N-type impurity concentration of the ohmic drain region 7 (N+) is higher than that of the N-type low-concentration drain region 3. The ohmic drain region 7 (N+) is disposed adjacent to the N-type low-concentration drain region 3 in a manner such that the ohmic drain region 7 (N+) is disposed opposite to the P-type channel region 9 when viewed from the N-type low-concentration drain region 3. The practical N-type impurity concentration of the ohmic drain region 7 (N+) is substantially the same as that of the source region 5 (N+), and is approximately, for example, $2 \times 10^{20}$ pcs/cm$^3$.

The P-type impurity concentration of the ohmic channel region 11 (P+) is higher than that of the P-type channel region 9. The ohmic channel region 11 (P+) is disposed adjacent to the P-type channel region 9 in a manner such that the ohmic channel region 11 (P+) is disposed opposite to the N-type low-concentration drain region 3 when viewed from the P-type channel region 9. In this embodiment, two ohmic channel regions 11 (P+) are provided in a manner such that each of the those ohmic channel regions 11 (P+) is disposed adjacent to the source region 5 (N+) and the source region 5 (N+) is sandwiched by those ohmic channel regions 11 (P+) when viewed from the top as shown in FIG. 2. For example, the practical P-type impurity concentration of the ohmic channel region 11 (P+) is approximately $1 \times 10^{20}$ pcs/cm$^3$.

The gate electrode 15 is disposed on the P-type channel region 9 and a part of the N-type low-concentration drain region 3 disposed adjacent to the P-type channel region 9.

When viewed from the top, the drain-side end of the gate electrode 15 in the channel length direction (the lateral direction in FIG. 1) is separated from the ohmic drain region 7 (N+) and disposed on the N-type low-concentration drain region 3. On the other hand, the ends of the gate electrode 15 in the channel width direction (the vertical direction in FIG. 2) are disposed on the element separating isolation film 17.

When viewed from the top, the length in the channel length direction of an overlapping area where the gate electrode 15 is formed on the part of the N-type low-concentration drain region 3 is, for example, 0.5 μm or more. Further, when viewed from the top, the distance in the channel length direction between the gate electrode 15 and the ohmic drain region 7 (N+) is, for example, 0.5 μm or more. However, the length in the channel length direction of an overlapping area where the gate electrode 15 is disposed on the part of the N-type low-concentration drain region 3 may be less than 0.5 μm, and the distance in the channel length direction between the gate electrode 15 and the ohmic drain region 7 (N+) may be less than 0.5 μm.

In the MOS transistor according to this embodiment of the present invention, the ohmic channel regions 11 (P+) are formed to obtain a voltage of the P-type channel region 9. Further, the P-type channel region 9 includes two channel layers 9a and 9b having different P-type impurity concentrations from each other. In those channel layers 9a and 9b, the closer the channel layer is disposed to the surface side (upper side) of the silicon layer 1c, the lower the P-type impurity concentration becomes. In other words, the P-type impurity concentration of the channel layer 9b in contact with the buried oxide film 1b is higher than that of the channel layer 9a. By doing this, it may become possible to increase the threshold value voltage of the parasitic MOS transistor formed of the P-type semiconductor substrate 1a, the buried oxide film 1b, and the P-type channel region 9; thereby enabling controlling the leakage current in this portion and increasing the breakdown voltage of the MOS transistor.

Further, each of the N-type low-concentration drain region 3, the source region 5 (N+), the ohmic drain region 7 (N+), and the P-type channel region 9 is in contact with the buried oxide film 1b. By having this feature, it becomes possible to manufacture the MOS transistors within a thin silicon layer 1c. As a result, it becomes possible to greatly reduce the junction capacitance between the P-type channel region 9 and the N-type low-concentration drain region 3 and the junction capacitance between the P-type channel region 9 and the source region 5 (N+), thereby increasing the operating speed of the MOS transistor.

Further, in the P-type channel region 9, the P-type impurity concentration of the channel layer 9a is lower than that of the channel layer 9b. Further, in the N-type low-concentration drain region 3, the N-type impurity concentration of the upper-side low-concentration drain layer 3a (N+−) is higher than that of the lower-side low-concentration drain layer 3b (N−). By having this feature, under the gate isolation film 13, it becomes possible that the difference of the concentrations or the ratio of the concentrations between the upper-side low-concentration drain layer 3a (N+−) and the upper-side channel layer 9a is larger than the difference of the concentrations or the ratio of the concentrations between the lower-side low-concentration drain layer 3b (N−) and the lower-side channel layer 9b.

Figure 3A:
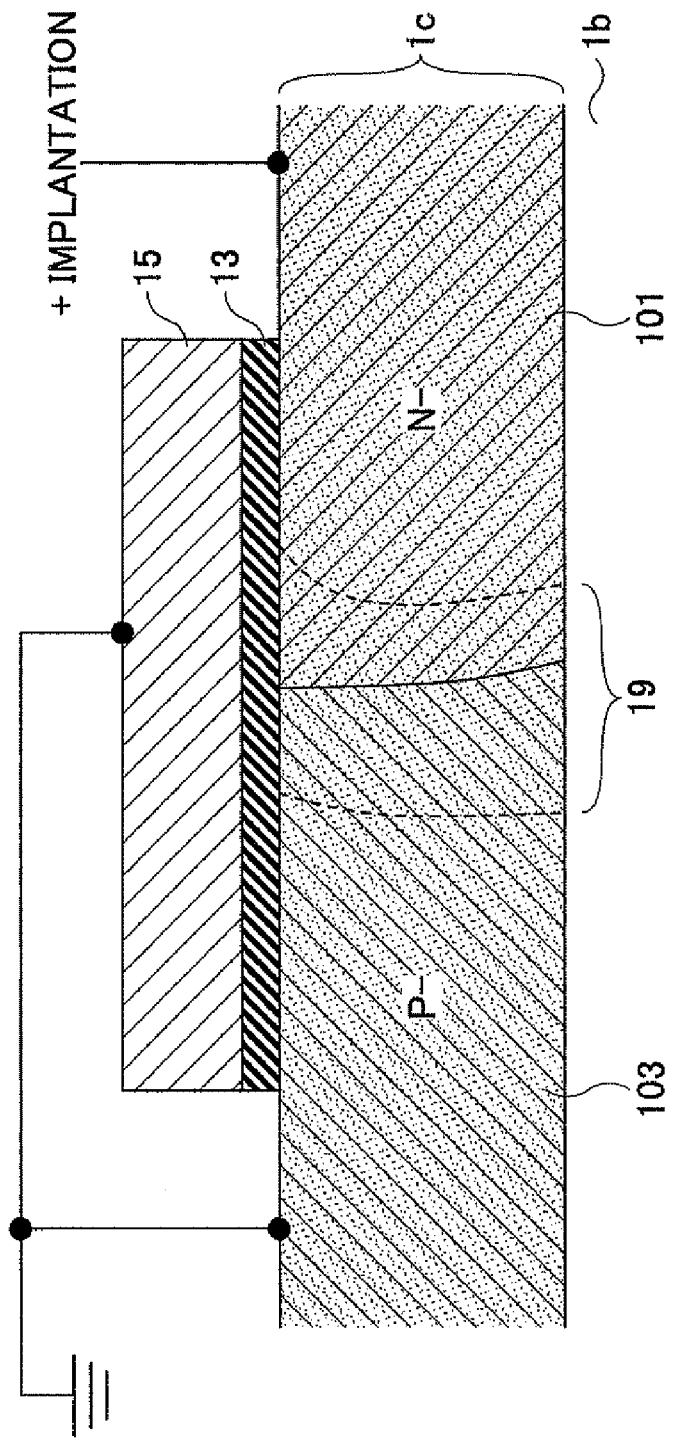
FIG. 3A is a cross-sectional view showing how a depletion layer is extended in a conventional MOS transistor.
Figure 3B:
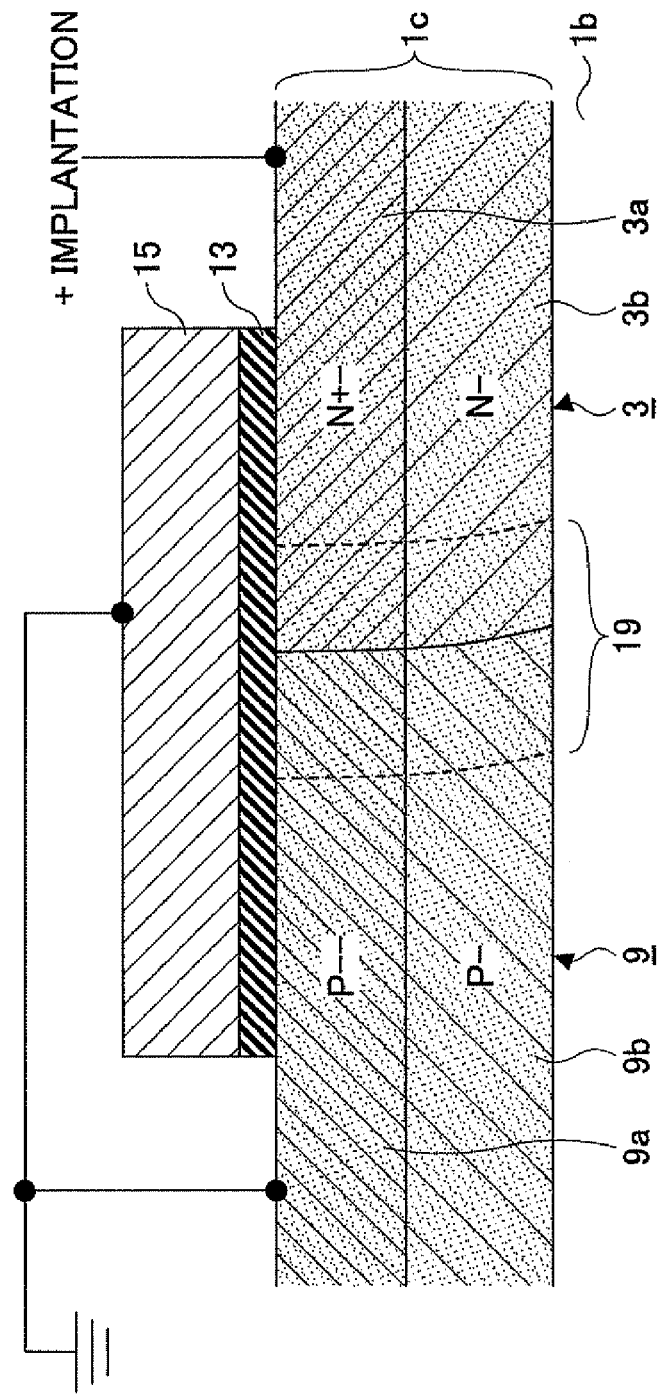
FIG. 3B is a cross-sectional view showing how the depletion layer is extended in a MOS transistor according to an embodiment of the present invention.

Because of this feature, as shown in FIG. 3B, a depletion layer 19 is more likely to be extended to the side of the P-type channel region 9. As a result, the degree of the extension of the depletion layer 19 in the upper-side low-concentration drain layer 3a (N+−) and the upper-side channel layer 9a can be fitted to that of the depletion layer 19 in the lower-side low-concentration drain layer 3b (N−) and the lower-side channel layer 9b. Also, it becomes possible to reduce the change of the curvature of the depletion layer 19 generated in the PN junction between the N-type low-concentration drain region 3 and the P-type channel region 9. As a result, it becomes possible to improve the breakdown voltage of the PN junction when the MOS transistor is OFF.

Further, when viewed from the top, the drain-side end of the gate electrode 15 in the channel length direction is disposed on the N-type low-concentration drain region 3. Because of this feature, when the MOS transistor is ON, when viewed from the top, in the part where the gate electrode 15 overlaps the N-type low-concentration drain region 3, the drain electric field in the lateral direction is alleviated. As a result, it may become possible to reduce the substrate current and improve the breakdown voltage of the MOS transistor during the operation of the MOS transistor.

Further, when viewed from the top, the gate electrode 15 and the ohmic drain region 7 (N+) are separated from each other. Because of this feature, the drain electric field in the lateral direction when the MOS transistor is OFF is alleviated.

As described above, in the MOS transistor according to an embodiment of the present invention, it may become possible to improve the off-state breakdown voltage and the on-state breakdown voltage. Further, the N-type low-concentration drain region 3, the source region 5 (N+), and the P-type channel region 9 are formed in a manner such that those regions are in contact with the silicon layer 1c. Because of this structure, it may become possible to manufacture the SOI substrate 1 including the silicon layer 1c having the greatly reduced junction capacitance between regions.

Further, the P-type channel region 9 includes the channel layers 9a and 9b, and the P-type impurity concentration of the channel layer 9a is different from that of the channel layer 9b by more than ten times. Because of this feature, the above-described effects when the P-type impurity concentration of the channel layer 9b is higher than that of the channel layer 9a, the channel layer 9b being in contact with the buried oxide film 1b, can be promoted; and similarly, the above-described effects when the P-type impurity concentration of the channel layer 9a is lower than that of the channel layer 9b, the channel layer 9a being disposed under the gate isolation film 13, can also be promoted.

Further, when viewed from the top, the ohmic channel regions 11 (P+) are formed where the source-side end of the gate electrode 15 and the element separating isolation film 17 are crossed. By having this feature, it may become possible to prevent the leakage current flowing at the end of the element separating isolation film 17 under the source-side end of the gate electrode 15.

Figure 4:
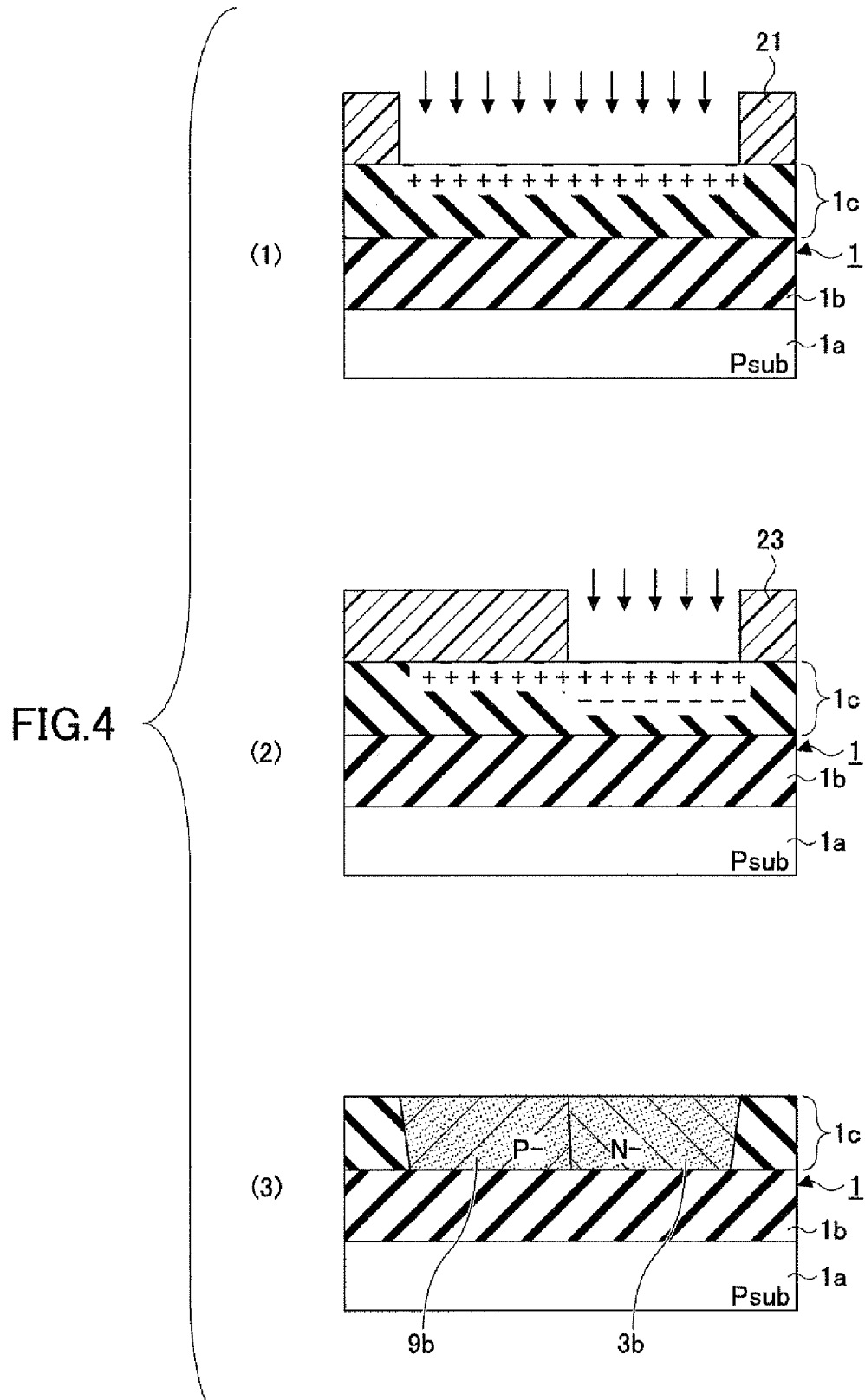
FIG. 4 has process cross-sectional views illustrating first to third manufacturing processes of the semiconductor device of FIGS. 1 and 2.
Figure 5:
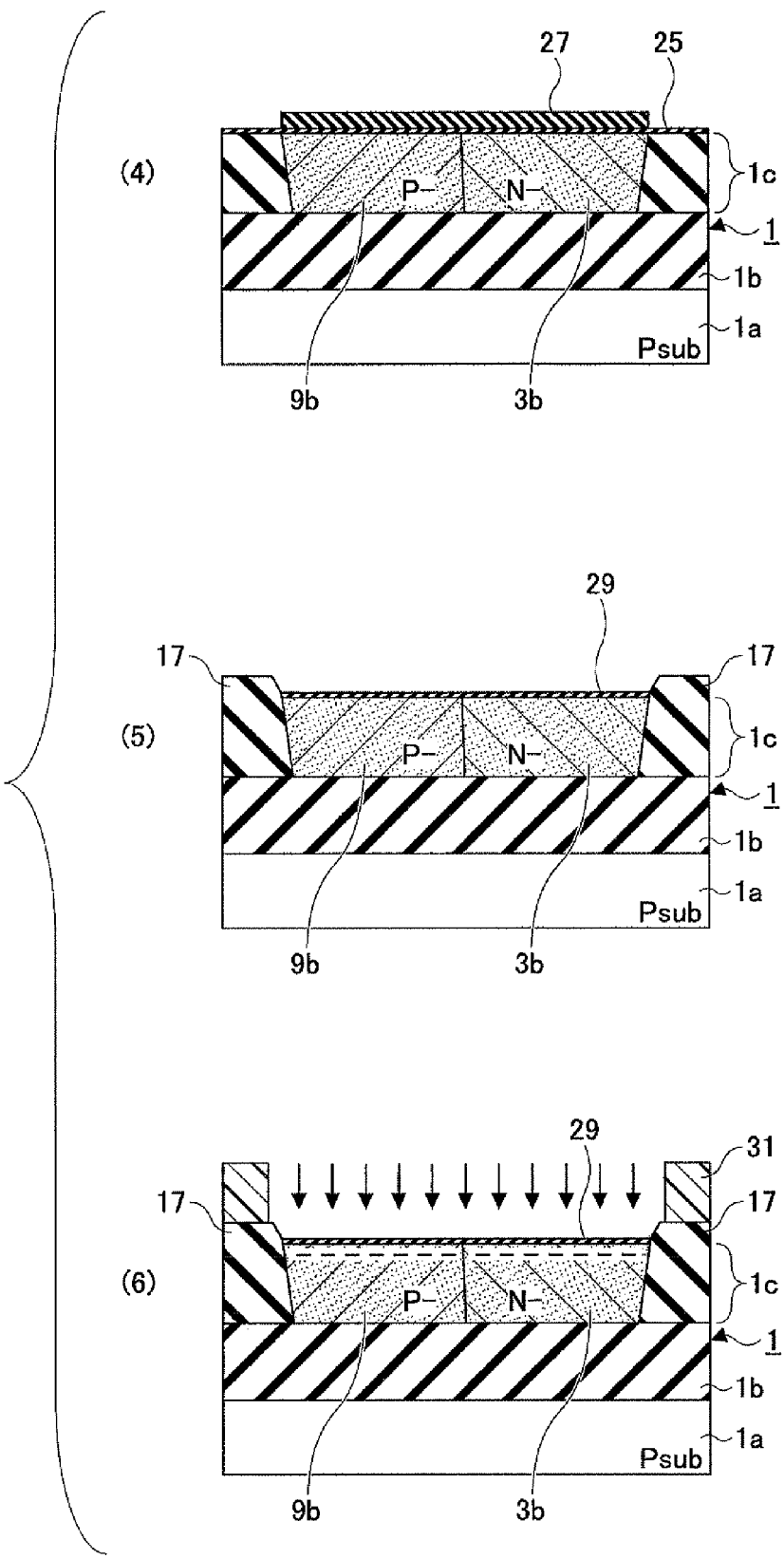
FIG. 5 has process cross-sectional views illustrating fourth to sixth manufacturing processes of the semiconductor device of FIGS. 1 and 2.
Figure 6:
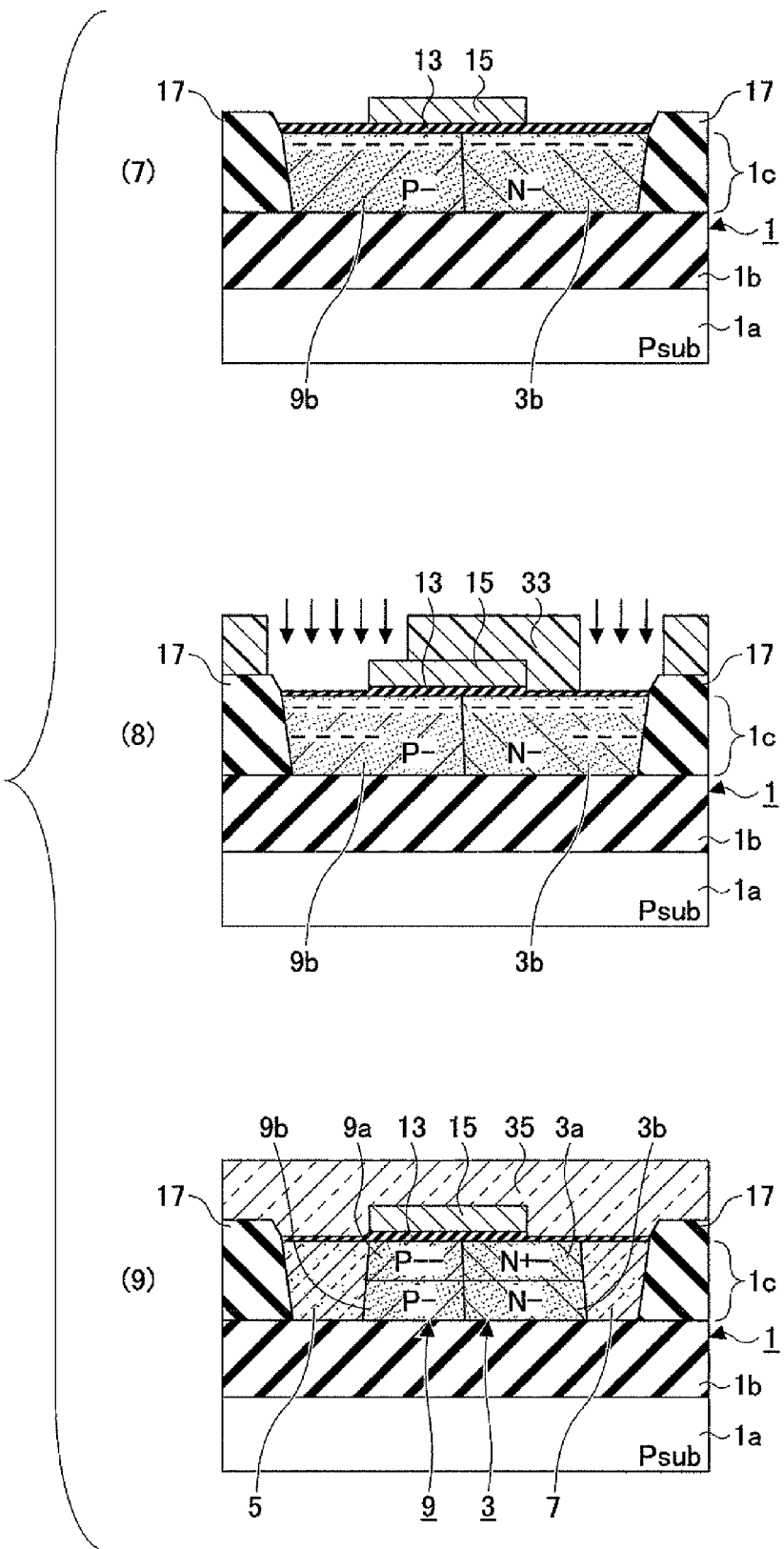
FIG. 6 has process cross-sectional views illustrating seventh to ninth manufacturing processes of the semiconductor device of FIGS. 1 and 2.

FIGS. 4, 5, and 6 are process cross-sectional views, cut along line A-A of FIG. 2, illustrating an exemplary manufacturing process of the SOI substrate 1 with the MOS transistor according to an embodiment of the present invention. The numbers in parentheses (1) through (9) in FIGS. 4, 5, and 6 correspond to the numbers in parentheses (1) through (9) of the processes described below.

(1): As shown in FIG. 4, the buried oxide film 1b is formed on the P-type semiconductor substrate 1a. Further, the silicon layer 1c is formed on (bonded onto) the buried oxide film 1b to form the SOI substrate 1. By a photoengraving technique, a photoresist 21 is formed on the silicon layer 1c via a buffer oxide film (not shown), the photoresist 21 having an opening where an N-channel MOS transistor is to be formed. By an ion implantation technique, using the photoresist 21 as a mask, the boron impurity (marked as "+") is implanted into the silicon layer 1c at implantation energy of 50 keV and at dose amount of $4 \times 10^{12}$ pcs/cm$^3$.

(2): The photoresist 21 is removed. By the photoengraving technique, a photoresist 23 is formed on the silicon layer 1c via a buffer oxide film (not shown), the photoresist 23 having an opening where the drain region of the MOS transistor is to be formed, the drain region including the N-type low-concentration drain region 3 and the ohmic drain region 7 (N+). By the ion implantation technique, using the photoresist 23 as a mask, the phosphorous impurity (marked as "−") is implanted into the silicon layer 1c at implantation energy of 150 keV and at dose amount of $6 \times 10^{12}$ pcs/cm$^3$. When the phosphorous impurity is implanted into the silicon layer 1c, preferably, the dose amount of the phosphorous impurity is not greatly different from that of the boron impurity.

(3): The photoresist 23 is removed. The SOI substrate 1 is heated at a temperature of 1,000° C. for 120 minutes to form the low-concentration drain layer 3b (N−) and the channel layer 9b (P−) in the silicon layer 1c. In this case, each of the low-concentration drain layer 3b (N−) and the channel layer 9b (P−) is formed so as to have a depth from the surface (upper surface) of the silicon layer 1c to the surface (upper surface) of the buried oxide film 1b.

(4): Next, as shown in FIG. 5, in order to form an element separating isolation film 17 using the LOCOS (local oxidation of silicon) method, first, a buffer oxide film 25 is formed on the surface of the silicon layer 1c. Then, a silicon nitride film 27 is formed on the buffer oxide film 25, the silicon nitride film 27 covering a region where the MOS transistor is to be formed and having an opening where the element separating isolation film 17 is to be formed.

(5): The SOI substrate 1 is heated to perform the LOCOS oxidation to form the element separating isolation film 17 around the region where the MOS transistor is to be formed. In this case, the element separating isolation film 17 is formed so as to have a depth to reach the buried oxide film 1b. The element separating isolation film 17 is formed of the LOCOS oxidation film. By having the element separating isolation film 17, the regions where the respective MOS transistors are to be formed are separated from each other. Then, the silicon nitride film 27 and the buffer oxide film 25 are removed. The SOI substrate 1 is heated to form a pregate oxide film 29 having a film thickness of approximately 40 nm on the surface of the silicon layer 1c.

(6): By the photoengraving technique, a photoresist 31 is formed on the element separating isolation film 17, the photoresist 31 having an opening where the MOS transistor is to be formed. By the ion implantation technique, using the photoresist 31 as a mask, the phosphorous impurity (marked as "−") is implanted into the silicon layer 1c (i.e., the low-concentration drain layer 3b (N−) and the channel layer 9b (P−)) at implantation energy of 100 keV and at dose amount of $2 \times 10^{12}$ pcs/cm$^3$.

(7): As shown in FIG. 6, the photoresist 31 is removed. Further, the pregate oxide film 29 is removed. The SOI substrate 1 is heated to form a silicon oxide film having a film thickness of approximately 120 nm on the surface of the silicon layer 1c (i.e., the low-concentration drain layer 3b (N−) and the channel layer 9b (P−)), the silicon oxide film becoming the gate isolation film 13. Then a polysilicon film is formed on the gate isolation film 13 and the element separating isolation film 17. Then, by patterning the polysilicon film, the gate electrode 15 is formed.

(8): By the photoengraving technique, a photoresist 33 is formed, the photoresist 33 having an opening where the source region 5 (N+) and the ohmic drain region 7 (N+) are to be formed. By the ion implantation technique, using the photoresist 33 as a mask, the phosphorous impurity (marked as "−") is implanted into the silicon layer 1c (i.e., the low-concentration drain layer 3b (N−) and the channel layer 9b (P−)) at implantation energy of 50 keV and at dose amount of $6 \times 10^{15}$ pcs/cm³.

(9): The photoresist 33 is removed. By the photoengraving technique and the ion implantation technique, the boron impurity is implanted into the channel layer 9b (P−) to form the ohmic channel regions 11s (P+) (see FIG. 2). Then, an interlayer isolation film 35 is formed. The SOI substrate 1 is heated at a temperature of approximately 920° C. for approximately 20 minutes to activate the impurity implanted in the previous process. By doing this, the low-concentration drain layer 3a (N+−) is formed on the surface (upper surface) side of the low-concentration drain layer 3b (N−), so that the N-type low-concentration drain region 3 having the low-concentration drain layer 3a (N+−) and the low-concentration drain layer 3b (N−) is formed. Further, similarly, the upper-side channel layer 9a is formed on the surface (upper surface) side of the channel layer 9b (P−), so that the P-type channel region 9 having the channel layers 9a and 9b is formed. Further, the source region 5 (N+), the ohmic drain region 7 (N+), and the ohmic channel regions 11s (P+) (see FIG. 2) are formed. After that, a general wiring process (not shown) is performed to complete the manufacturing procedure of the semiconductor device.

Figure 7:
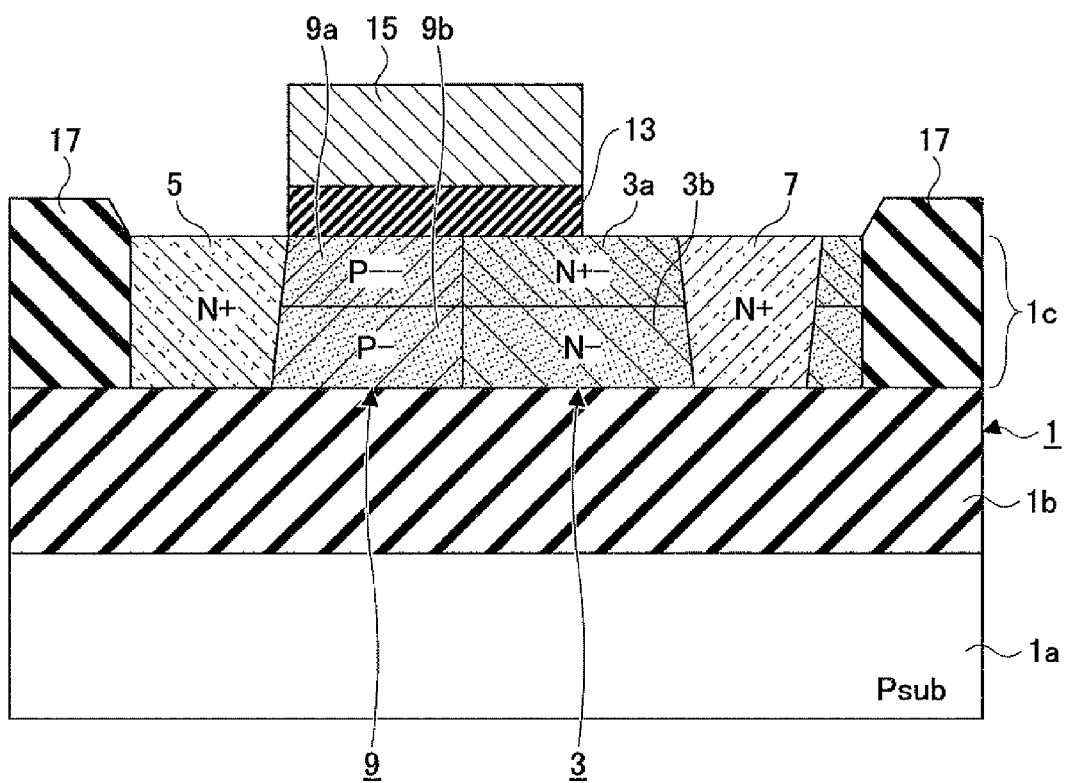
FIG. 7 is a schematic cross-sectional view of an MOS transistor of a semiconductor device according to another embodiment of the present invention, the view being cut along line B-B in FIG. 8.
Figure 8:
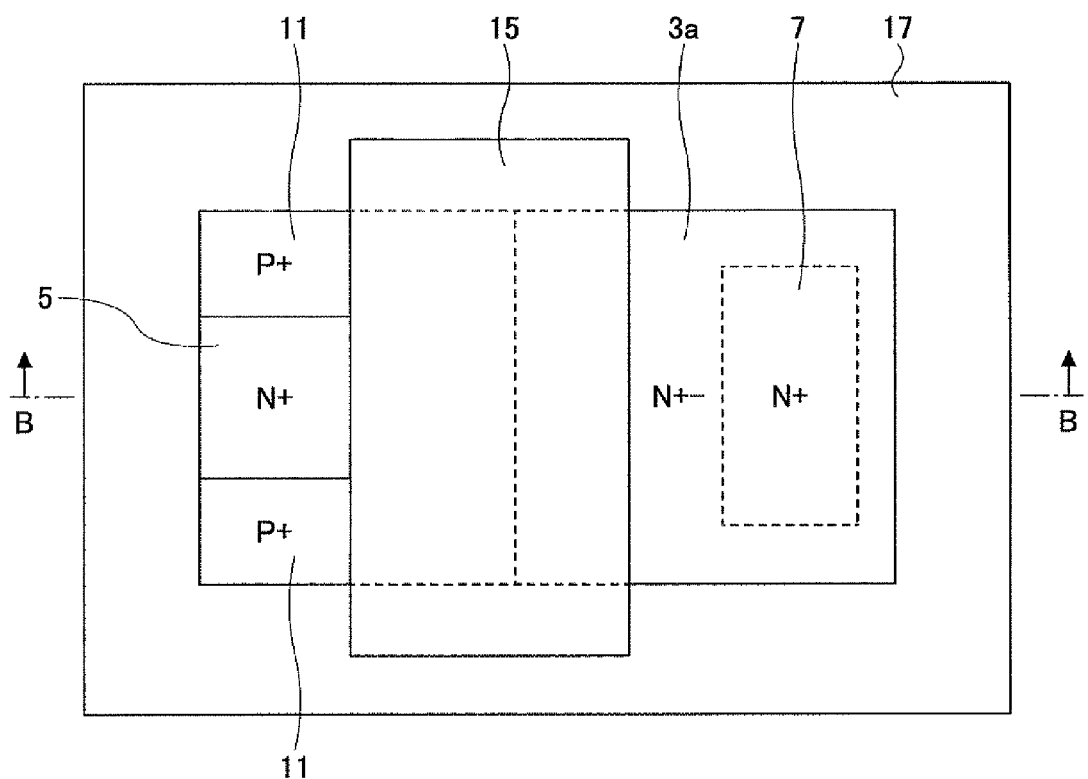
FIG. 8 is a schematic top view of the MOS transistor of FIG. 7.

FIGS. 7 and 8 schematically illustrate an MOS transistor of a semiconductor device according to another embodiment of the present invention.

Specifically, FIG. 7 is a cross-sectional view cut along line B-B of FIG. 8, and FIG. 8 is a top view of the semiconductor device of FIG. 7. In FIGS. 7 and 8, the same reference numerals are used for the same elements in FIGS. 1 and 2.

The configuration in this embodiment is different from that in FIGS. 1 and 2 in that the ohmic drain region 7 (N+) and the element separating isolation film 17 are separated from each other. When viewed from the top as shown in FIG. 8, the circumference of the ohmic drain region 7 (N+) is surrounded by the N-type low-concentration drain region 3. This configuration of this embodiment may be specifically effective when the leakage current is likely to be generated between the ohmic drain region 7 (N+) and the element separating isolation film 17.

Figure 9:
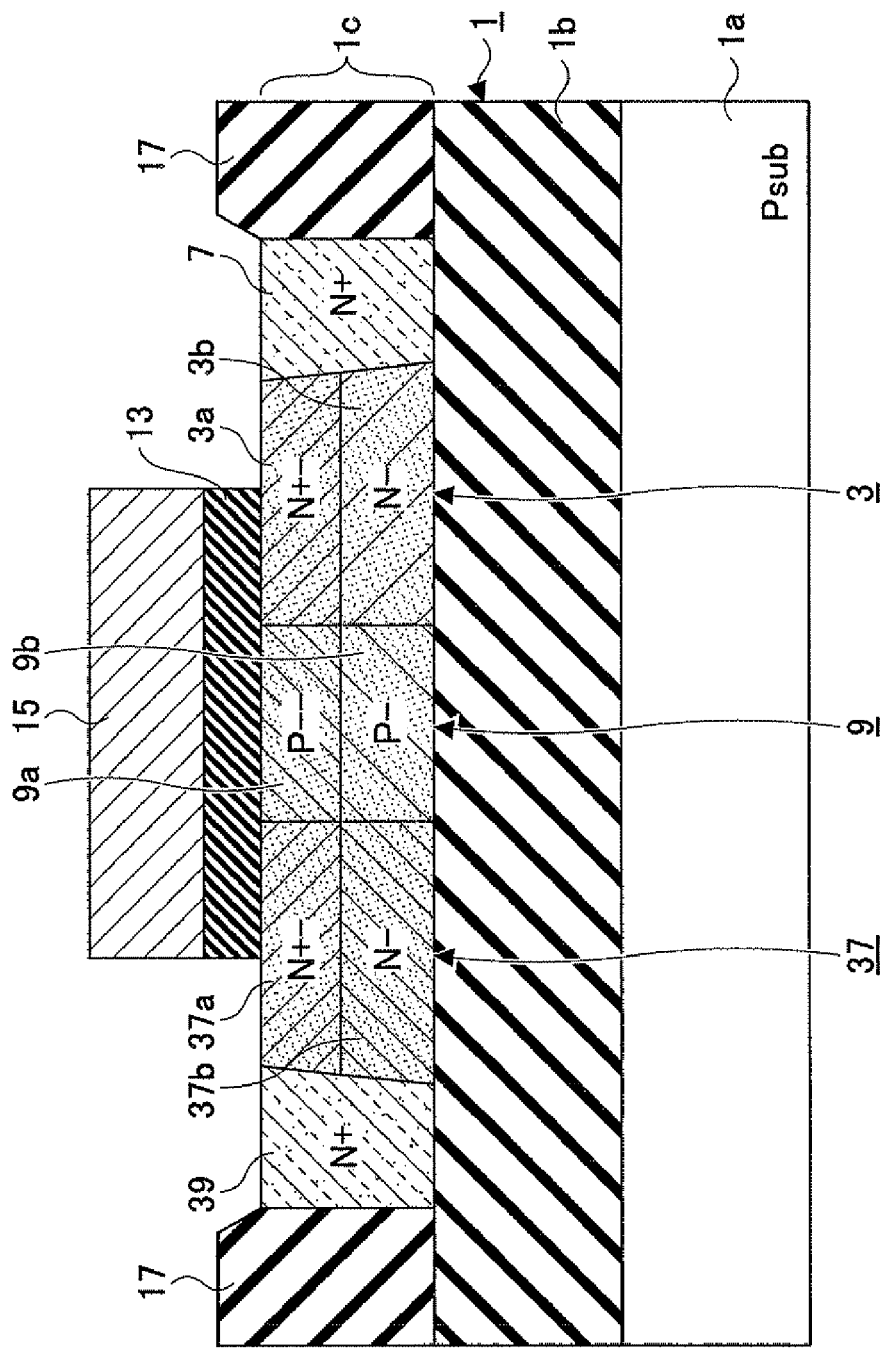
FIG. 9 is a schematic cross-sectional view of an MOS transistor of a semiconductor device according to still another embodiment of the present invention, the view being cut along line C-C in FIG. 10.
Figure 10:
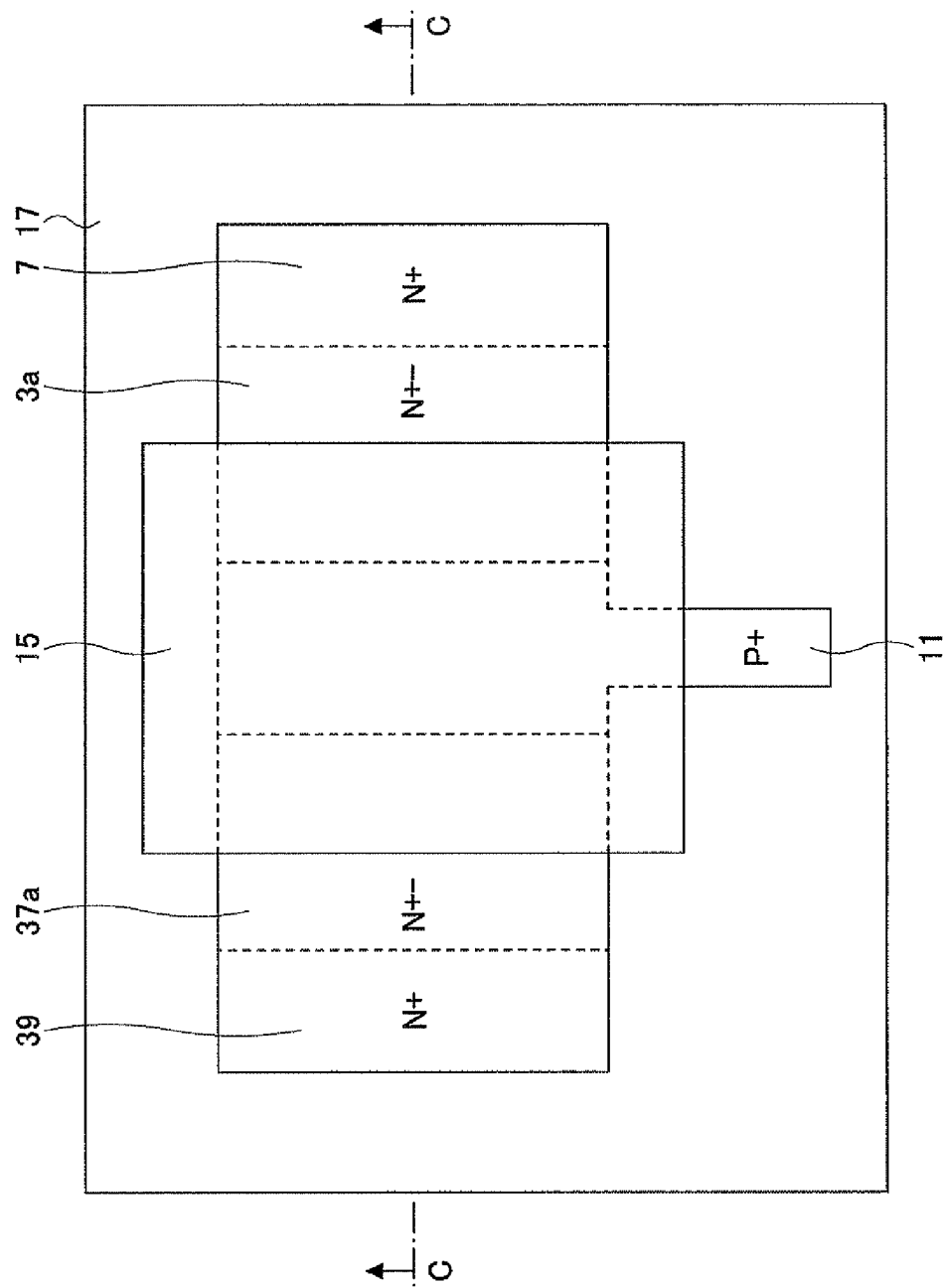
FIG. 10 is a schematic top view of the MOS transistor of FIG. 9.

FIGS. 9 and 10 schematically illustrate an MOS transistor of a semiconductor device according to still another embodiment of the present invention.

Specifically, FIG. 9 is a cross-sectional view cut along line C-C of FIG. 10, and FIG. 10 is a top view of the semiconductor device of FIG. 9. In FIGS. 9 and 10, the same reference numerals are used for the same elements in FIGS. 1 and 2.

The configuration in this embodiment is different from that in FIGS. 1 and 2 in that the source and the drain have substantially the same configuration with each other and the ohmic channel region 11 (P+) may be disposed (formed) adjacent to the P-type channel region 9 in the channel width direction (the vertical direction in FIG. 8) of the MOS transistor.

In this configuration, the source includes a low-concentration source region 37 and an ohmic source region 39, the low-concentration source region 37 corresponding to the N-type low-concentration drain region 3 and the ohmic source region 39 corresponding to the ohmic drain region 7 (N+). The low-concentration drain region 37 includes low-concentration source layers 37a and 37b corresponding to the low-concentration drain layer 3a (N+−) and the low-concentration drain layer 3b (N−), respectively.

The ohmic channel region 11 (P+) is in contact with the P-type channel region 9 at a part of the P-type channel region 9, the part being extruded in the channel width direction (vertical direction in FIG. 10) of the MOS transistor from the area in between the N-type low-concentration drain region 3 and the low-concentration drain region 37 which part becomes a channel.

In this embodiment, as described above, the source and the drain have substantially the same configuration with each other. It may become possible to use the MOS transistor without distinguishing between the source and the drain.

Further, as described above, the ohmic channel region 11 (P+) is in contact with the P-type channel region 9 in the channel width direction of the MOS transistor. Because of this feature, the voltage of the P-type channel region 9 may be controlled separately from the voltages of the source and the drain. This configuration may be specifically effective for an analog circuit.

In the embodiment illustrated in FIGS. 9 and 10, each of the ohmic drain region 7 (N+) and the ohmic source region 39 is in contact with the element separating isolation film 17. On the other hand, in a case of FIGS. 11 and 12, each of the ohmic drain region 7 (N+) and the ohmic source region 39 may be separated from the element separating isolation film 17, which is similar to the embodiment shown in FIGS. 7 and 8.

Figure 13:
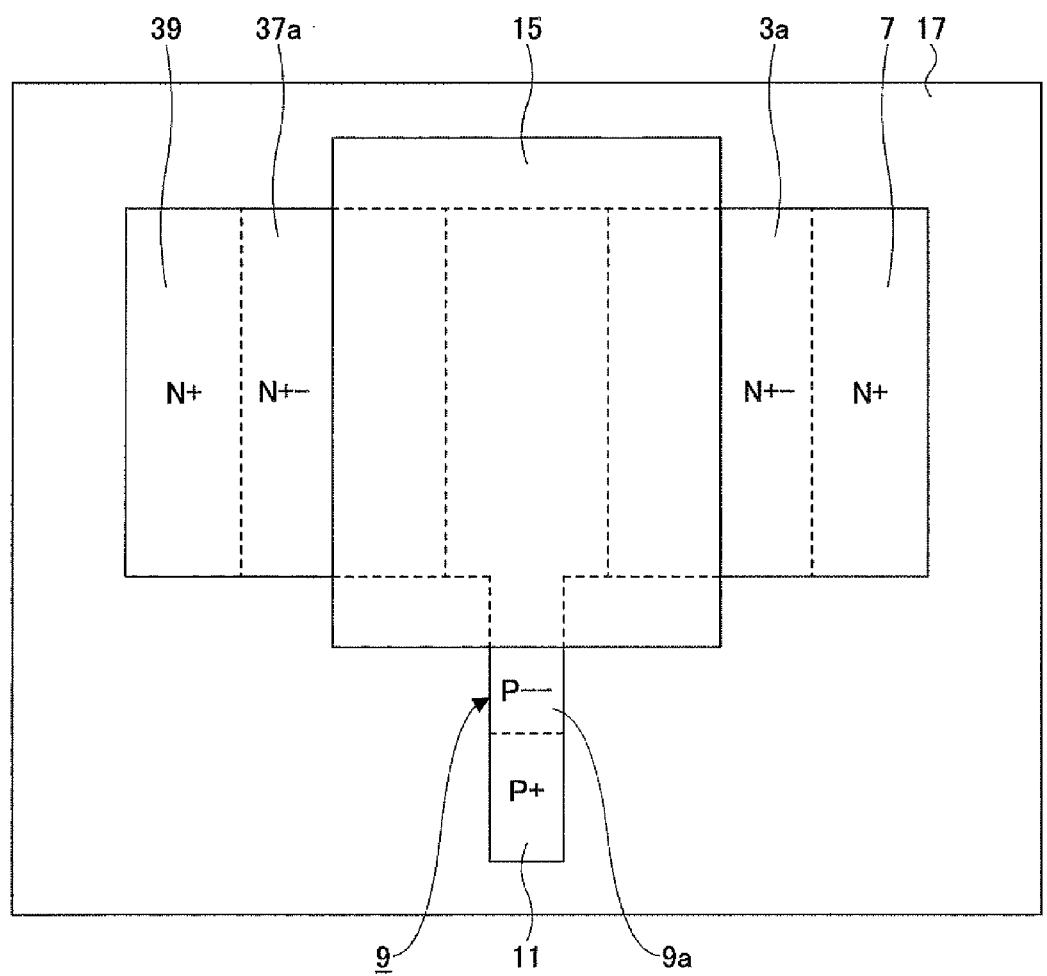
FIG. 13 is a schematic top view of the MOS transistor according to still another embodiment of the present invention.

Further, as shown in a top view of FIG. 13, when compared with the embodiment of FIGS. 9 and 10 and viewed from the top, the ohmic channel region 11 (P+) may be disposed to be separated from the gate electrode 15 at a distance. The applied voltage to the P-type channel region 9 is generally dominated by the distance between the ohmic channel region 11 (P+) and the N-type low-concentration drain region 3 and between the ohmic channel region 11 (P+) and the low-concentration drain region 37. Because of this feature, when viewed from the top, by disposing the P-type channel region 9 between the ohmic channel region 11 (P+) and the gate electrode 15, it may become possible to increase the voltage applied to the P-type channel region 9.

Figure 11:
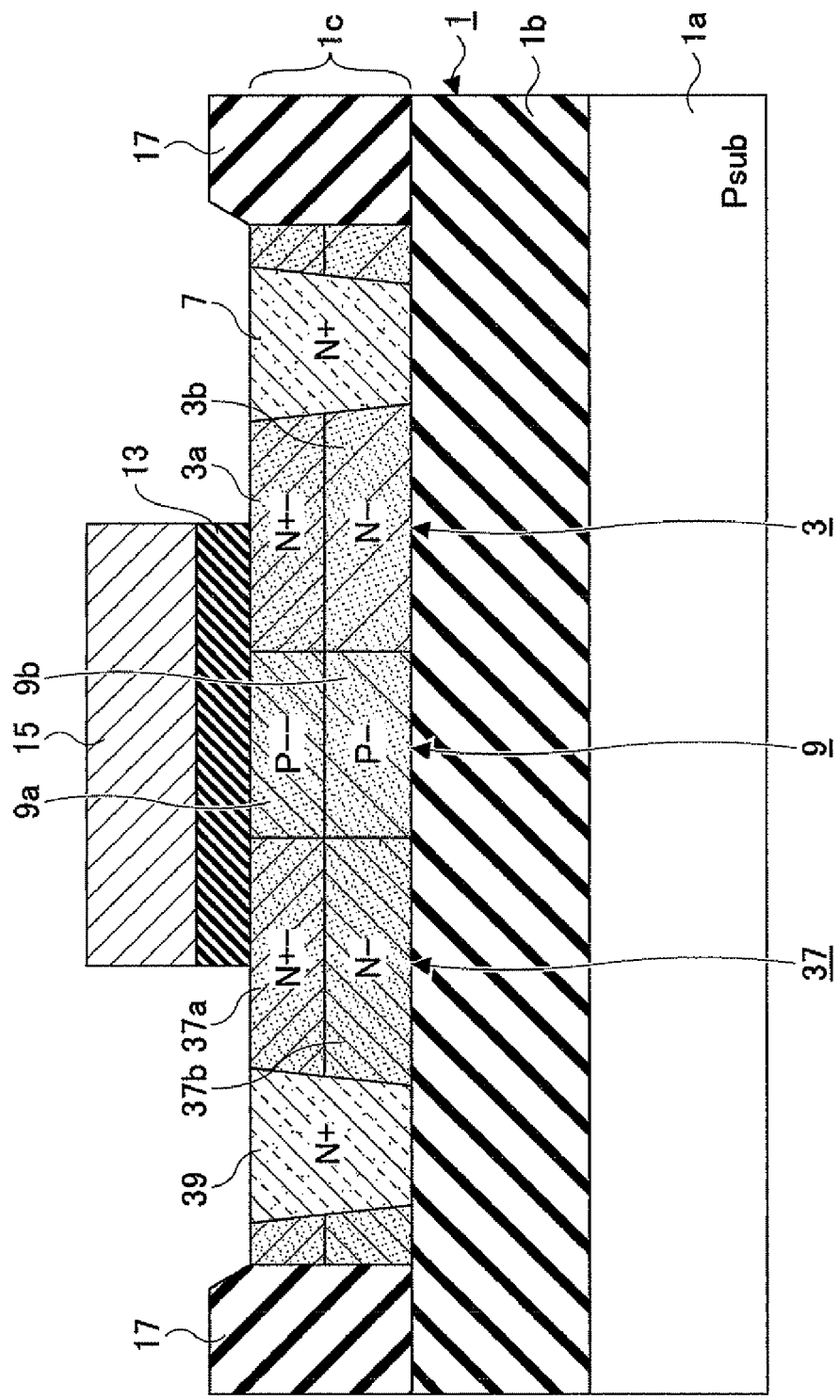
FIG. 11 is a schematic cross-sectional view of an MOS transistor of a semiconductor device according to still another embodiment of the present invention, the view being cut along line D-D in FIG. 12.
Figure 12:
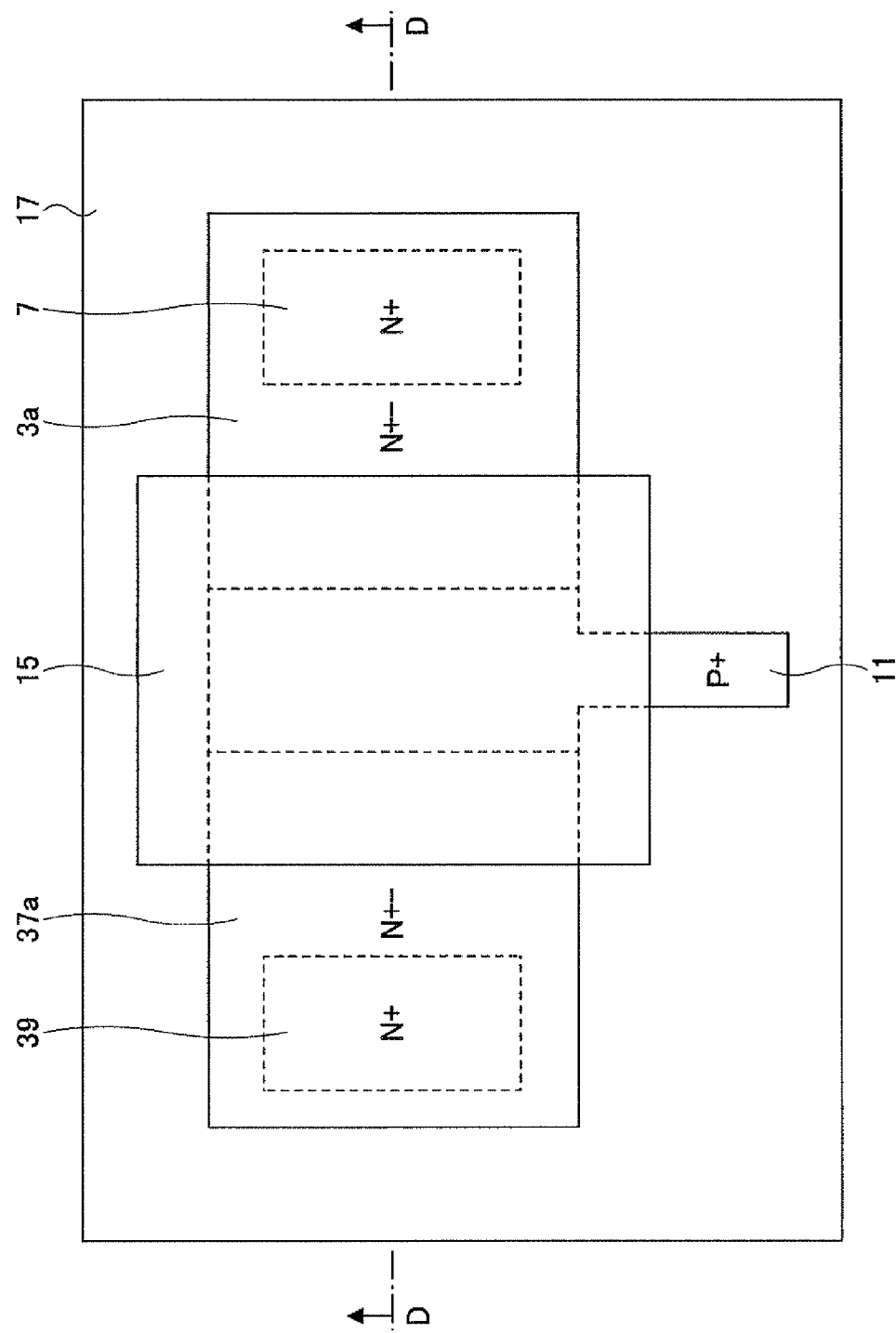
FIG. 12 is a schematic top view of the MOS transistor of FIG. 11.

Further, in the embodiment of FIG. 13, similar to the embodiment of FIGS. 11 and 12, each of the ohmic drain region 7 (N+) and the ohmic source region 39 may be separated from the element separating isolation film 17.

Further, the configuration where the ohmic channel region 11 (P+) is in contact with the P-type channel region 9 in the channel width direction of the MOS transistor may also be applied to the configuration of FIGS. 1 and 2 and the configuration of FIGS. 7 and 8.

Further, the structures according to the embodiments of FIGS. 7 through 13 may be similarly formed by modifying the above manufacturing procedure illustrated with respect to FIGS. 4 through 6 by changing the reticle layout pattern of the opening for forming the photoresist.

Figure 14:
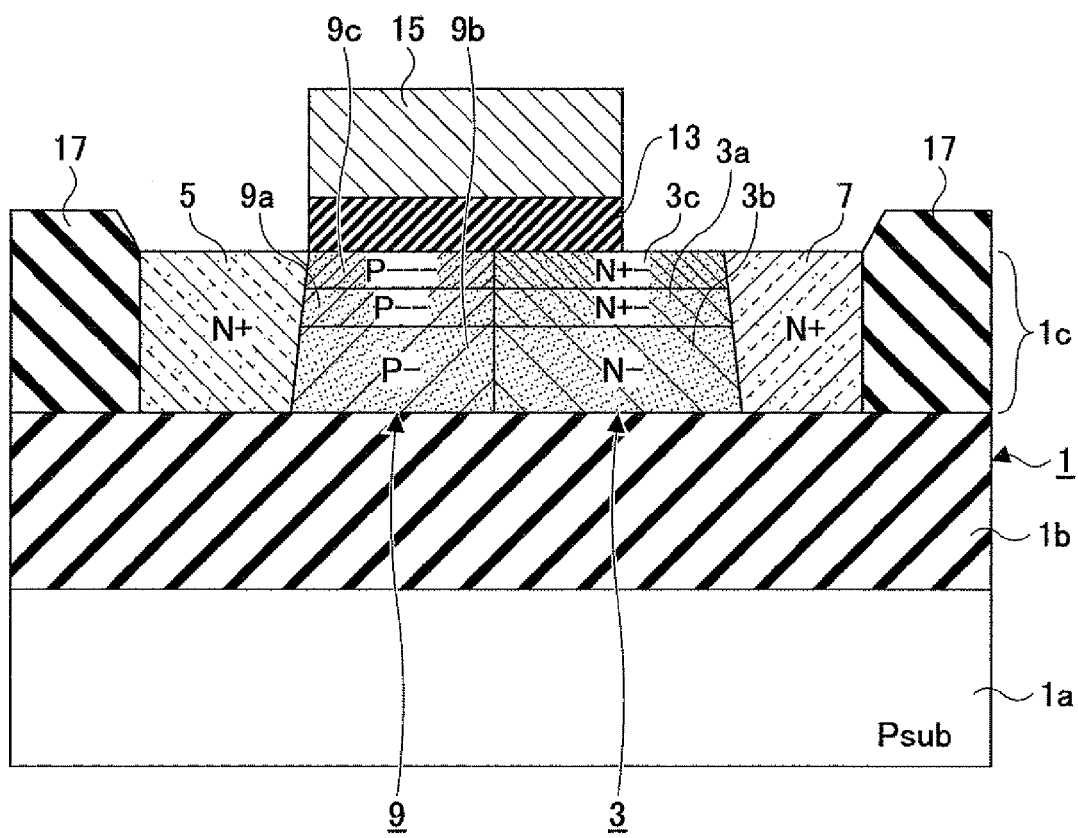
FIG. 14 is a schematic cross-sectional view of an MOS transistor of a semiconductor device according to still another embodiment of the present invention, the view being cut along line E-E in FIG. 15.
Figure 15:
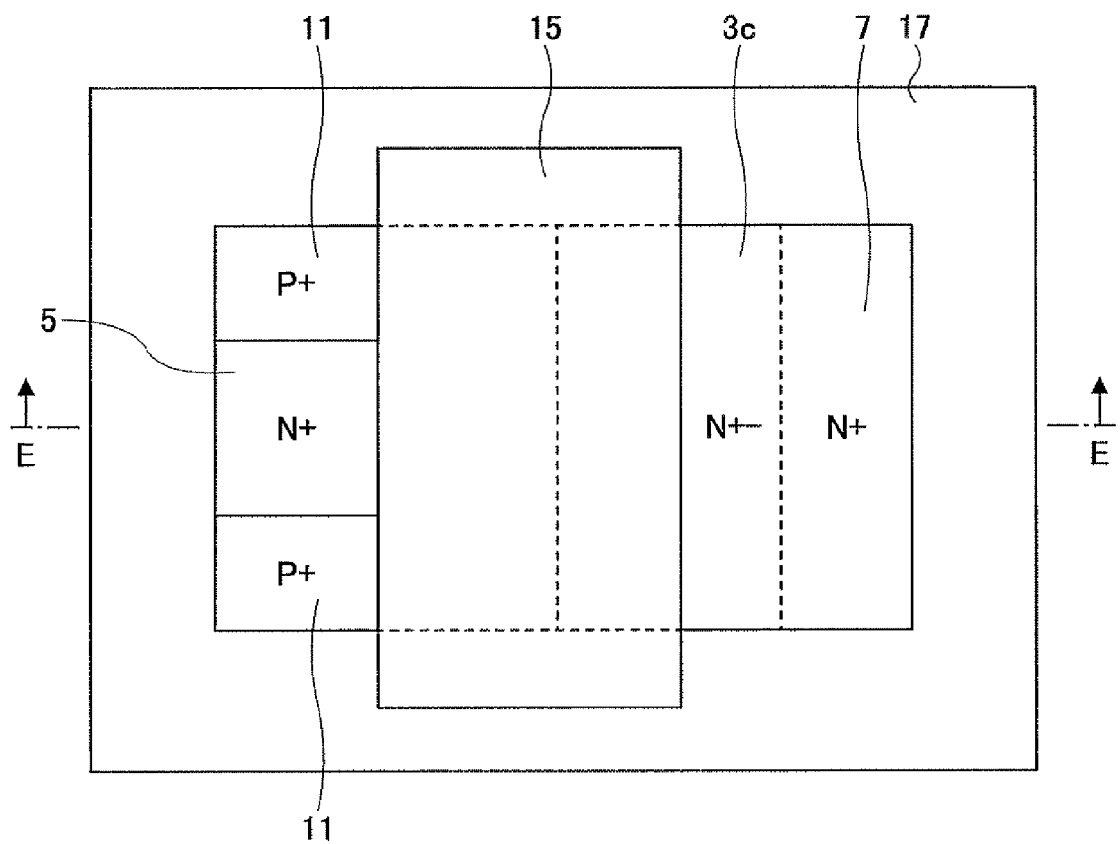
FIG. 15 is a schematic top view of the MOS transistor of FIG. 14.

FIGS. 14 and 15 schematically illustrate an MOS transistor of a semiconductor device according to still another embodiment of the present invention.

Specifically, FIG. 14 is a cross-sectional view cut along line E-E of FIG. 15, and FIG. 15 is a top view of the semiconductor device of FIG. 14. In FIGS. 14 and 15, the same reference numerals are used for the same elements in FIGS. 1 and 2.

In this embodiment, the N-type low-concentration drain region 3 includes three low-concentration drain layers 3a, 3b, and 3c, and the P-type channel region 9 includes three channel layers 9a, 9b, and 9c.

The low-concentration drain layer 3c (N+−) is disposed (formed) on the surface (upper surface) of the low-concentration drain layer 3a (N+−); namely, the low-concentration drain layer 3c (N+−) is disposed (formed) as the uppermost layer in the N-type low-concentration drain region 3. The N-type impurity concentration of the low-concentration drain layer 3c (N+−) is higher than that of the low-concentration drain layer 3a (N+−). In this embodiment, the N-type impurity concentration of the low-concentration drain layer 3c (N+−) is slightly higher than that of the low-concentration drain layer 3b (N−) but is substantially the same as that of the low-concentration drain layer 3a (N+−). In this embodiment, the N-type impurity concentration of the low-concentration drain layer 3c (N+−) is, for example, approximately $2.5 \times 10^{17}$ pcs/cm$^3$.

The channel layer 9c (P−−−) is disposed (formed) on the surface (upper surface) of the channel layer 9a; namely, the channel layer 9c (P−−−) is disposed (formed) as the uppermost layer in the P-type channel region 9. The P-type impurity concentration of the channel layer 9c (P−−−) is lower than that of the channel layer 9a. In this embodiment, the P-type impurity concentration of the channel layer 9c (P−−−) is, for example, approximately $4 \times 10^{15}$ pcs/cm$^3$.

By having the structure of this embodiment, an operation and an effect similar to those in the embodiment of FIGS. 1 and 2 may be obtained.

Figure 16:
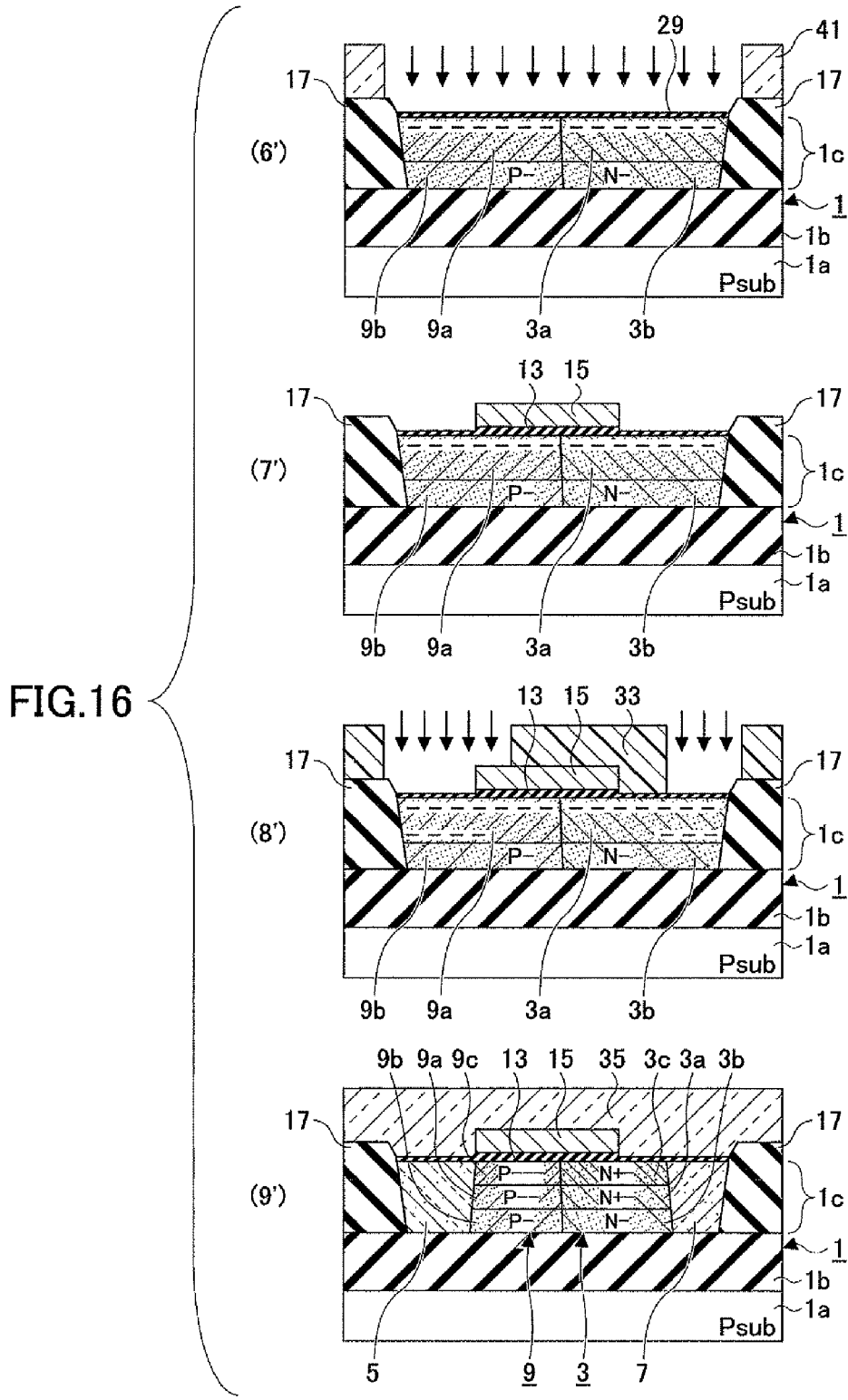
FIG. 16 has process cross-sectional views illustrating sixth to ninth manufacturing processes of the semiconductor device of FIGS. 14 and 15.

FIG. 16 is a process cross-sectional view, cut along line E-E of FIG. 15, illustrating an exemplary manufacturing process of the SOI substrate 1 according to this embodiment of the present invention. The numbers in parentheses (6') through (9') in FIG. 16 corresponds to the numbers in parentheses (6') through (9') of the processes described below.

The procedure before the step (6') is the same as that in the steps (1) through (6) described with reference to FIGS. 4 and 5.

(6'): As shown in FIG. 16, after the above step (6) described with reference to FIG. 5, the photoresist 31 is removed. Then, the SOI substrate 1 is heated at a temperature of approximately 900° C. for approximately 20 minutes. By doing this, the low-concentration drain layer 3a (N+−) is formed on the surface (upper surface) of the low-concentration drain layer 3b (N−), and the channel layer 9a is formed on the surface (upper surface) of the channel layer 9b. Then, by the photoengraving technique, a photoresist 41 is formed on the element separating isolation film 17, the photoresist 41 having an opening where the MOS transistor is to be formed. By the ion implantation technique, using the photoresist 41 as a mask, the phosphorous impurity (marked as "−") is implanted into the silicon layer 1c (i.e., the low-concentration drain layer 3a (N+−) and the channel layer 9a) at implantation energy of 50 keV and at dose amount of $5 \times 10^{11}$ pcs/cm$^3$. In this implantation of the phosphorous impurity, the phosphorous impurity is to be implanted into the surface side of the silicon layer 1c as much as possible.

(7'): The photoresist 41 is removed. Similar to the above step (7) described with reference to FIG. 6, the gate isolation film 13 formed of a silicon oxide film and having a film thickness of approximately 120 nm is formed on the surface of the silicon layer 1c (i.e., the low-concentration drain layer 3a (N+−) and the channel layer 9a), and the gate electrode 15 is formed on the gate isolation film 13.

(8'): Similar to the above process (8) described with reference to FIG. 6, by the ion implantation technique, using the photoresist 33 as a mask, the phosphorous impurity (marked as "−") is implanted into the silicon layer 1c (i.e., the low-concentration drain layer 3a (N+−) or the low-concentration drain layer 3b (N−) and the channel layer 9a or the channel layer 9b (P−)) at implantation energy of 50 keV and at dose amount of $6 \times 10^{15}$ pcs/cm$^3$.

(9'): Similar to the above process (9) described with reference to FIG. 6, the boron impurity is implanted to form the ohmic channel regions 11s (P+) (see FIG. 15), and then, the interlayer isolation film 35 is formed. The SOI substrate 1 is heated at a temperature of approximately 920° C. for approximately 20 minutes to activate the impurities implanted in the previous process. By doing this, the low-concentration drain layer 3c (N+−) is formed on the surface (upper surface) side of the low-concentration drain layer 3a (N+−), so that the N-type low-concentration drain region 3 including low-concentration drain layers 3a, 3b, and 3c, is formed. Further, the channel layer 9c (P−−−) is formed on the surface (upper surface) side of the channel layer 9a, so that the P-type channel region 9 including the channel layers 9a, 9b, and 9c is formed. Further, the source region 5 (N+), the ohmic drain region 7 (N+), and the ohmic channel regions 11s (P+) (see FIG. 15) are formed. After that, a general wiring process (not shown) is performed to complete the manufacturing procedure of the semiconductor devices.

As described above, the structure of the embodiment as illustrated in FIGS. 14 and 15 may be similarly formed by adding the ion implantation process in the step (6') to the procedure described with reference to FIGS. 4 through 6.

In a case where a desired breakdown voltage is obtained, if a desired threshold value of the MOS transistor is not obtained, by modifying the manufacturing procedure as described above in this embodiment, it may become possible to obtain the desired threshold value of the MOS transistor while obtaining the above-described effect at the same time.

In the ion implantation for controlling (adjusting) the threshold value of the MOS transistor, to minimize the concentration change on the surface (upper surface) side of the N-type low-concentration drain region 3 and the P-type channel region 9, as the manufacturing step described with reference to FIG. 16, the SOI substrate 1 is heated to leave the low-concentration drain layers 3a and the channel layer 9a for securing the breakdown voltage. After the low-concentration drain layers 3a and the channel layer 9a are formed, the low-concentration drain layer 3c (N+−) and the channel layer 9c (P−−−) are formed in a manner such that the low-concentration drain layer 3c (N+−) and the channel layer 9c (P−−−) are formed on the upper side (part) of the low-concentration drain layers 3a and the channel layer 9a, respectively. In this case, preferably, the acceleration voltage for the ion implantation for forming the low-concentration drain layer 3c (N+−) and the channel layer 9c (P−−−) is lowered.

According to an embodiment of the present invention, in the second-conductivity-type channel region, the second-conductivity-type impurity concentration of a lowermost channel layer may differ from that of an uppermost channel layer by more than ten times.

According to an embodiment of the present invention, when viewed from the top, a size of an overlap area where the gate electrode is formed on the part of the first-conductivity-type low-concentration drain region is equal to or greater than 0.5 μm, and a distance between the gate electrode and the ohmic drain region is equal to or greater than 0.5 μm.

Further, similar to the first-conductivity-type low-concentration drain region and the ohmic drain region, the source region may include a low-concentration source region and an ohmic source region. In this case, the low-concentration source region may be disposed adjacent to the second-conductivity-type channel region and have plural low-concentration source layers having a first-conductive-type impurity concentration configuration similar to that of the first-conductivity-type low-concentration drain region. The ohmic source region may be disposed adjacent to the opposite to the low-concentration source region in a manner such that the ohmic source region is disposed opposite to the second-conductivity-type channel region when viewed from the low-concentration source region and have the same first-conductive-type impurity concentration configuration as that of the ohmic drain region.

Further, the ohmic channel region may be disposed adjacent to the second-conductivity-type channel region in a channel width direction of the MOS transistor.

In this case, when viewed from the top, the ohmic channel region may be disposed to be separated from the gate electrode.

In a semiconductor device according to an embodiment of the present invention, the MOS transistor includes the ohmic channel region to secure the voltage of the channel region. Further, the channel region includes plural channel layers having different the second-conductivity-type impurity concentrations from each other in a manner such that the closer the channel layer is disposed to the surface side (upper side) of the silicon layer 1c, the lower the second-conductivity-type impurity concentration becomes. In other words, it becomes possible to make the second-conductivity-type impurity concentration of the channel layer adjacent to the buried oxide film higher than that of any other layer. By doing this, it may become possible to increase the threshold value voltage of the parasitic MOS transistor formed among the supporting substrate, the buried oxide film, and the channel region. As a result, the leakage current of this portion may be better controlled and a higher-voltage MOS transistor may be provided.

Further, the source region, the low-concentration drain region, the channel region, and the ohmic drain region are formed so as to reach the buried oxide film. Because of this feature, it may become possible to manufacture the MOS transistors within a thin silicon layer. As a result, the junction capacitance between the channel region and the low-concentration drain region and the junction capacitance between the channel region and the source region may be greatly reduced, thereby increasing the operating speed of the MOS transistor.

Further, in an N-channel MOS transistor, when the MOS transistor is OFF, the gate electrode and the channel regions are grounded and a reversed voltage is applied to the low-concentration drain region. Under this condition, regarding the PN junction between the channel region and the low-concentration drain region, in a conventional MOS transistor, an electric field in the vertical direction is generated. In this case, as shown in FIG. 3A, if the impurity concentration in the low-concentration drain region 101 is too low, the extension of the depletion layer 19 in the channel region 103 (P−) becomes larger than that in the low-concentration drain region 101 (see the dotted lines of FIG. 3A). When compared with a case of a PN junction not disposed under the gate electrode 15, in a case of the PN junction between the low-concentration drain region 101 and the channel region 103 (P−) under the gate electrode 15, the curvature of the extension of the depletion layer 19 becomes larger. Because of this feature, due to concentration of the electric field, the breakdown voltage of the PN junction is generally reduced.

On the other hand, in a semiconductor device according to an embodiment of the present invention, the channel region includes plural channel layers having different second-conductive-type impurity concentration from each other in a manner such that the closer the channel layer is to the surface of the silicon layer, the lower the second-conductive-type impurity concentration of the channel layer becomes, and the low-concentration drain region includes plural low-concentration drain layers having different first-conductive-type impurity concentration from each other in a manner such that the closer the low-concentration drain layer is to the surface of the silicon layer, the higher the first-conductive-type impurity concentration of the low-concentration drain layer becomes. By having this feature, under the gate isolation film, a difference or a ratio in the impurity concentration between the low-concentration drain and the channel region (low-concentration drain/channel region) may be increased; therefore, the change of the curvature of the depletion layer in the PN junction between the low-concentration drain and the channel region may be reduced.

For example, as shown in FIG. 3B, in the P-type channel region 9, the P-type impurity concentration in the upper channel layer 9a (P−−) is lower than that in the lower channel layer 9b (P−). Further, in the N-type low-concentration drain region 3, the N-type impurity concentration in the upper low-concentration drain layer 3a (N+−) is higher than that in the low-concentration drain layer 3b (N−). By doing in this way, it may become possible that the difference or the ratio in the impurity concentration between the upper low-concentration drain layer 3a (N+−) and the upper channel layer 9a (P−−) is grater than that between the lower low-concentration drain layer 3b (N−) and the channel layer 9b (P−).

By doing this, in the upper low-concentration drain layer 3a (N+−) and the upper channel layer 9a (P−−), the depletion layer 19 is more likely to be expanded. As a result, the degree of the extension of the depletion layer 19 in the upper-side low-concentration drain layer 3a (N+−) and the upper-side channel layer 9a can be fitted to that of the depletion layer 19 in the lower-side low-concentration drain layer 3b (N−) and the lower-side channel layer 9b. Also, it becomes possible to reduce the change of the curvature of the depletion layer 19 of the PN junction between the N-type low-concentration drain region 3 and the P-type channel region 9. As a result, it becomes possible to improve the breakdown voltage of the PN junction when the MOS transistor is OFF.

Further, when viewed from the top, the drain-side end of the gate electrode 15 in the channel length direction is disposed on the N-type low-concentration drain region 3. Because of this feature, when the MOS transistor is ON, when viewed from the top, in the part where the gate electrode 15 overlaps the N-type low-concentration drain region 3, the drain electric field in the lateral direction is alleviated. As a result, it becomes possible to improve the breakdown voltage of the MOS transistor during the operation of the MOS transistor.

Further, when viewed from the top, the gate electrode 15 and the ohmic drain region 7 (N+) are disposed to be separated from each other. Because of this feature, the drain electric field in the lateral direction when the MOS transistor is ON is alleviated.

As described above, in the MOS transistor according to an embodiment of the present invention, it may become possible to improve the off breakdown voltage and the on breakdown voltage. Further, the N-type low-concentration drain region 3, the source region 5 (N+), and the P-type channel region 9 are formed in a manner such that those regions are in contact with (reach) the silicon layer 1c. Because of this feature, it may become possible to manufacture the SOI substrate 1 including the silicon layer 1c having the greatly reduced the junction capacitance between regions.

For example, the difference between the practical second-conductivity-type impurity concentration of the uppermost channel layer and that of the lower most channel layer is more than ten times. By doing in this way, it may become possible to remarkably improve the above-described effect when the second-conductivity-type impurity concentration of the lowermost channel layer being in contact with the buried oxide film is relatively increased and when the second-conductivity-type impurity concentration of the uppermost channel under the gate isolation film is relatively reduced. As a result, this configuration according to an embodiment of the present invention may be especially effective to manufacture the semiconductor device having the MOS transistor having a thin silicon layer.

Further, when the source has the same structure as that of the drain (i.e., when the source regions includes the low-concentration source region and the ohmic source region, the low-concentration source region including plural layers), it may become possible to use the MOS transistor without distinguishing between the source and the drain.

Further, as described above, the ohmic channel region is in contact with the channel region in the channel width direction of the MOS transistor. Because of this feature, the voltage of the channel region may be controlled separately from the source and the drain. This configuration may be specifically effective for an analog circuit.

Further, when viewed from the top, the ohmic channel region is disposed to be separated from the gate electrode. By doing in this way, it may become possible to prevent the depletion layer from reaching the ohmic channel region, the depletion layer being generated from the low-concentration drain region, when the MOS transistor is OFF, thereby increasing the breakdown voltage of the MOS transistor.

Although the invention has been described with respect to a specific embodiment for a complete and clear disclosure, the sizes, the dispositions, the values, the materials and the like described in the description are examples only. The present invention, therefore, is not limited to those examples. The appended claims are not to be thus limited but are to be construed as embodying all modifications and alternative constructions that may occur to one skilled in the art that fairly fall within the basic teaching herein set forth.

For example, in the above embodiments, a case is described where the P-type silicon layer 1c is used as a silicon layer of the SOI substrate 1. However, the silicon layer may be N-type or non-doped.

Further, in the above embodiments, a case is described where an N-channel MOS transistor is described as an example of the MOS transistor. However, when the opposite conductivity type of N type is used, the present invention may also be applied to a semiconductor device having a P-channel MOS transistor.

Further, in a case where the source includes the low-concentration source region and the ohmic source region, the overlap size between the gate electrode and the low-concentration source region and the size between the gate electrode and the ohmic source region in the source region are not always necessarily the same as those in the drain region. Those sizes including those in the drain side may be adequately changed on an as-needed basis depending on, for example, a voltage to be used.

The structure further including the low-concentration drain layer 3c (N+−) and the channel layer 9c (P−−−) may also be applied to any of the embodiments described above.

Further, the low-concentration drain region and the channel region may include four or more low-concentration drain layers and four or more channel layers, respectively.

Further, in the manufacturing steps described above, the ion implantation for forming the source region 5 (N+) or the ohmic source region 39 and the ohmic drain region 7 (N+) may be performed before or after the ion implantation for forming the ohmic channel region(s) 11 (P+).

The present invention may be applied to semiconductor devices having an MOS transistor formed on an SOI substrate. More specifically, the present invention may be applied to, for example, an in-vehicle high-voltage voltage monitoring IC and a multi-cell Li protection IC.

What is claimed is:

1. A semiconductor device including a supporting substrate, a buried oxide film formed on the supporting substrate, a silicon layer formed on the buried oxide film, an element separating isolation film included in the silicon layer, and an MOS transistor disposed in a region separated by the element separating isolation film, wherein the MOS transistor comprises:

a first-conductivity-type low-concentration drain region;

a source region;

an ohmic drain region;

a second-conductivity-type channel region;

an ohmic channel region;

a gate isolation film; and a gate electrode, wherein each of the first-conductivity-type low-concentration drain region, the source region, the ohmic drain region, the second-conductivity-type channel region, and the ohmic channel region is formed in the silicon layer so as to have a depth from a surface of the silicon layer to the buried oxide film, the gate isolation film is formed on the silicon layer so as to be formed on the second-conductivity-type channel region and the first-conductivity-type low-concentration drain region, the gate electrode is formed on the gate isolation film, the first-conductivity-type low-concentration drain region has relatively low first-conductive-type impurity concentration, the second-conductivity-type channel region has relatively low second-conductivity-type impurity concentration and is disposed adjacent to the first-conductivity-type low-concentration drain region, the source region has a first-conductive-type impurity concentration higher than that of the first-conductivity-type low-concentration drain region and is disposed adjacent to the second-conductivity-type channel region in a manner such that the source region is disposed opposite to the first-conductivity-type low-concentration drain region when viewed from the second-conductivity-type channel region, the ohmic drain region has the first-conductive-type impurity concentration higher than that of the first-conductivity-type low-concentration drain region and is disposed adjacent to the first-conductivity-type low-concentration drain region in a manner such that the ohmic drain region is disposed opposite to the second-conductivity-type channel region when viewed from the first-conductivity-type low-concentration drain region, the ohmic channel region has a second-conductive-type impurity concentration higher than that of the second-conductivity-type channel region and is disposed adjacent to the second-conductivity-type channel region, when viewed from a top, the gate electrode is formed on the second-conductivity-type channel region and a part of the first-conductivity-type low-concentration drain region adjacent to the second-conductivity-type channel region and is disposed in a manner such that the gate electrode is separated from the ohmic drain region, the second-conductivity-type channel region includes plural channel layers having different second-conductive-type impurity concentrations from each other in a manner such that the closer the channel layer is to the surface of the silicon layer, the lower the second-conductive-type impurity concentration of the channel layer becomes, and the first-conductivity-type low-concentration drain region includes plural low-concentration drain layers having different first-conductive-type impurity concentrations from each other in a manner such that the closer the low-concentration drain layer is to the surface of the silicon layer, the higher the first-conductive-type impurity concentration of the low-concentration drain layer becomes.

2. The semiconductor device according to claim 1, wherein in the second-conductivity-type channel region, the second-conductivity-type impurity concentration of a lowermost channel layer differs from that of an uppermost channel layer by more than ten times.

3. The semiconductor device according to claim 1, wherein when viewed from the top, a length of an overlap area where the gate electrode is formed on the part of the first-conductivity-type low-concentration drain region is equal to or greater than 0.5 μm, and a distance between the gate electrode and the ohmic drain region is equal to or greater than 0.5 μm.

4. The semiconductor device according to claim 1, wherein similar to the first-conductivity-type low-concentration drain region and the ohmic drain region, the source region includes a low-concentration source region and an ohmic source region, the low-concentration source region is disposed adjacent to the second-conductivity-type channel region and has plural low-concentration source layers having a same first-conductive-type impurity concentration configuration as that of the first-conductivity-type low-concentration drain region, and the ohmic source region is disposed adjacent to the low-concentration source region in a manner such that the ohmic source region is disposed opposite to the second-conductivity-type channel region when viewed from the low-concentration source region and has a same first-conductive-type impurity concentration configuration as that of the ohmic drain region.

5. The semiconductor device according to claim 1, wherein the ohmic channel region is disposed adjacent to the second-conductivity-type channel region in a channel width direction of the MOS transistor.

6. The semiconductor device according to claim 5, wherein when viewed from the top, the ohmic channel region is disposed to be separated from the gate electrode.

* * * * *